US011233465B2

(12) United States Patent
Takahashi

(10) Patent No.: US 11,233,465 B2
(45) Date of Patent: Jan. 25, 2022

(54) PIEZOELECTRIC DRIVE DEVICE, ROBOT, AND PRINTER

(71) Applicant: Seiko Epson Corporation, Tokyo (JP)

(72) Inventor: Tomoaki Takahashi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 295 days.

(21) Appl. No.: 16/666,935

(22) Filed: Oct. 29, 2019

(65) Prior Publication Data

US 2020/0136532 A1 Apr. 30, 2020

(30) Foreign Application Priority Data

Oct. 30, 2018 (JP) .............. JP2018-204226

(51) Int. Cl.
*H02N 2/14* (2006.01)
*H01L 41/04* (2006.01)
*H01L 41/08* (2006.01)
*B25J 9/12* (2006.01)
*B41J 2/045* (2006.01)
*H02N 2/10* (2006.01)
*H01L 41/318* (2013.01)

(52) U.S. Cl.
CPC .............. *H02N 2/147* (2013.01); *B25J 9/123* (2013.01); *B41J 2/04541* (2013.01); *B41J 2/04581* (2013.01); *H01L 41/042* (2013.01); *H01L 41/0825* (2013.01); *H02N 2/103* (2013.01); *H01L 41/318* (2013.01)

(58) Field of Classification Search
CPC ........ H02N 2/147; H02N 2/103; H02N 2/142; H02N 2/10; H02N 2/12; H01L 41/042; H01L 41/0825; H01L 41/318; B25J 9/123; B25J 9/12; B41J 2/04541; B41J 2/04581

See application file for complete search history.

(56) References Cited

U.S. PATENT DOCUMENTS 6,066,911 A * 5/2000 Lindemann ........... H01L 41/083
310/323.02
2003/0107298 A1* 6/2003 Matsushita ............ H02N 2/142
310/316.02

(Continued)

FOREIGN PATENT DOCUMENTS

JP H10-052072 A 2/1998
JP 2004-304963 A 10/2004
JP 2010-252471 A 11/2010

*Primary Examiner* — Emily P Pham
(74) *Attorney, Agent, or Firm* — Gang Yu

(57) ABSTRACT

A piezoelectric drive device has a first piezoelectric vibrator and a second piezoelectric vibrator each include a vibrating portion and a distal end portion in which the distal end portion make elliptic motion by stretching vibration and flexural vibration of the vibrating portion, a driven member driven by the elliptic motion of the distal end portion, a drive signal generation circuit that outputs stretching vibration drive signals to the first piezoelectric vibrator and the second piezoelectric vibrator, a first boosting circuit provided between the first piezoelectric vibrator and the drive signal generation circuit, a second boosting circuit provided between the second piezoelectric vibrator and the drive signal generation circuit, and a control circuit that controls boosting amounts of the stretching vibration drive signals.

8 Claims, 18 Drawing Sheets

(56) References Cited

U.S. PATENT DOCUMENTS

| | | | |
|---|---|---|---|
| 2010/0072858 A1* | 3/2010 | Ando | H01L 41/0906 310/323.16 |
| 2012/0328322 A1* | 12/2012 | Kosaka | G03G 15/80 399/88 |
| 2016/0226402 A1* | 8/2016 | Morita | H02N 2/0075 |
| 2017/0082828 A1* | 3/2017 | Sumioka | G02B 7/04 |

* cited by examiner

PIEZOELECTRIC DRIVE DEVICE, ROBOT, AND PRINTER

The present application is based on, and claims priority from, JP Application Serial Number 2018-204226, filed Oct. 30, 2018, the disclosure of which is hereby incorporated by reference herein in its entirety.

BACKGROUND

1. Technical Field

The present disclosure relates to a piezoelectric drive device, robot, and printer.

2. Related Art

A vibration actuator disclosed in JP-A-10-52072 has a vibrator including a plurality of electro-mechanical energy conversion elements. In the vibration actuator, alternating-current signals in a plurality of different phases are applied to the vibrator, standing wave is excited, and stretching vibration and flexural vibration are generated in the vibrator. Thereby, an acting portion of the vibrator may be vibrated in a circular or elliptical trajectory and the vibrator and a contactor in contact with the vibrator may be relatively moved. In this manner, the vibration actuator functions as an ultrasonic motor. To stably excite the standing wave, control of alternating-current signals is required for specific properties of the respective individuals of the vibration actuators.

A plurality of vibration actuators may be provided for one contactor. In this regard, the vibration actuators have individual differences in resonance frequency. For proper driving, drive circuits may be prepared for the respective vibration actuators or a common drive circuit may be used for the plurality of vibration actuators. However, there are problems that preparation of drive circuits for the respective vibration actuators causes upsizing of the vibration actuators and, on the other hand, using a common drive circuit for the plurality of vibration actuators destabilizes driving of part of the vibration actuators.

SUMMARY

A piezoelectric drive device according to an application example of the present disclosure has a first piezoelectric vibrator and a second piezoelectric vibrator including vibrating portions and distal end portions placed in the vibrating portions, in which the distal end portions make elliptic motion by stretching vibration and flexural vibration of the vibrating portions, a driven member driven by the elliptic motion of the distal end portions, a drive signal generation circuit that outputs stretching vibration drive signals generating the stretching vibration in the first piezoelectric vibrator and the second piezoelectric vibrator and flexural vibration drive signals generating the flexural vibration in the first piezoelectric vibrator and the second piezoelectric vibrator, a first boosting circuit provided between the first piezoelectric vibrator and the drive signal generation circuit, a second boosting circuit provided between the second piezoelectric vibrator and the drive signal generation circuit, and a control circuit that controls a boosting amount of the stretching vibration drive signal in the first boosting circuit and a boosting amount of the stretching vibration drive signal in the second boosting circuit, wherein the control circuit controls a resonance frequency of the first piezoelectric vibrator and a resonance frequency of the second piezoelectric vibrator to be close to each other.

DESCRIPTION OF EXEMPLARY EMBODIMENTS

As below, preferred embodiments of a piezoelectric drive device, robot, and printer according to the present disclosure will be explained in detail according to the accompanying drawings.

First Embodiment

Figure 1:
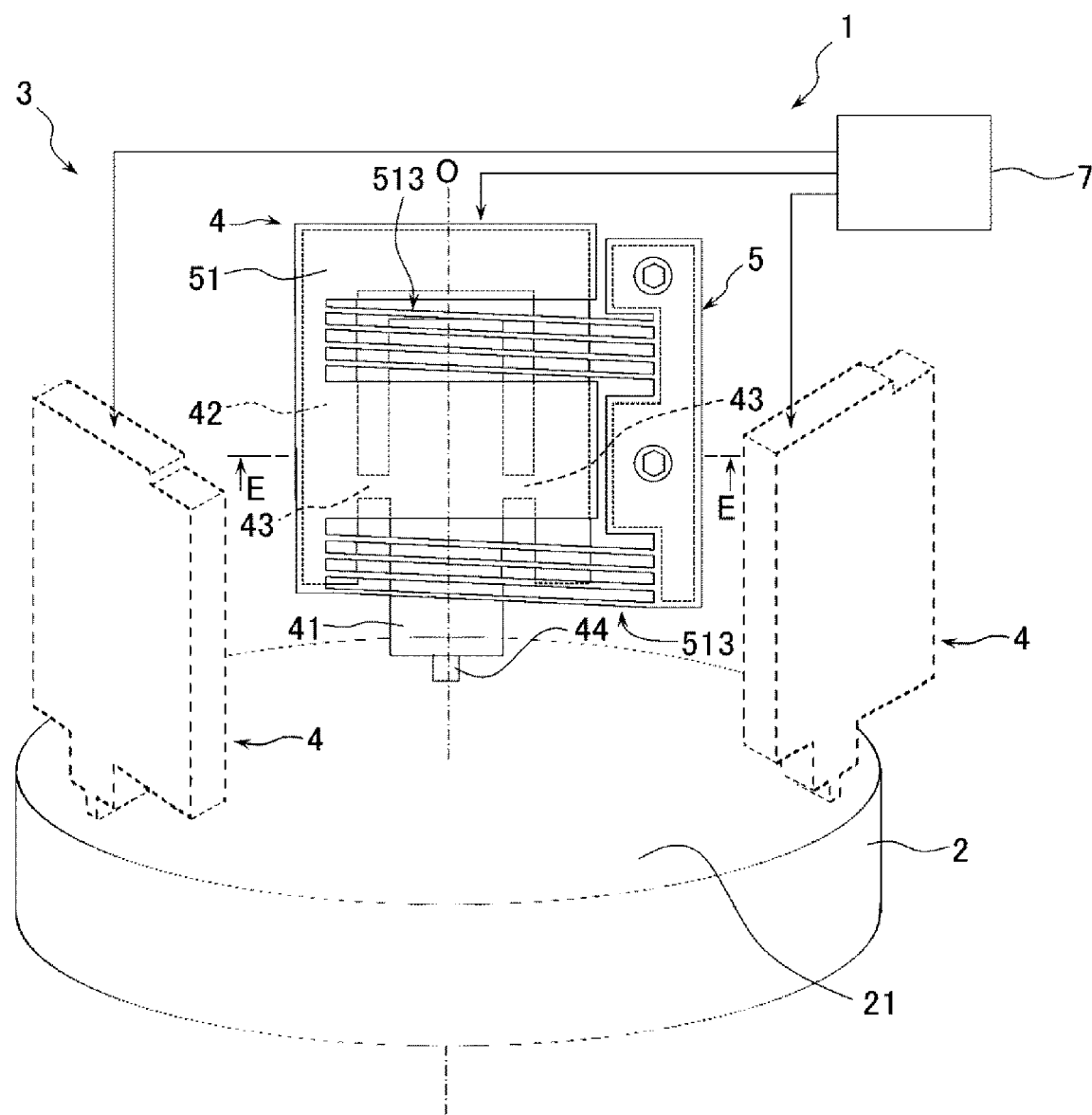
FIG. 1 is a perspective view showing a piezoelectric drive device according to a first embodiment.
Figure 2:
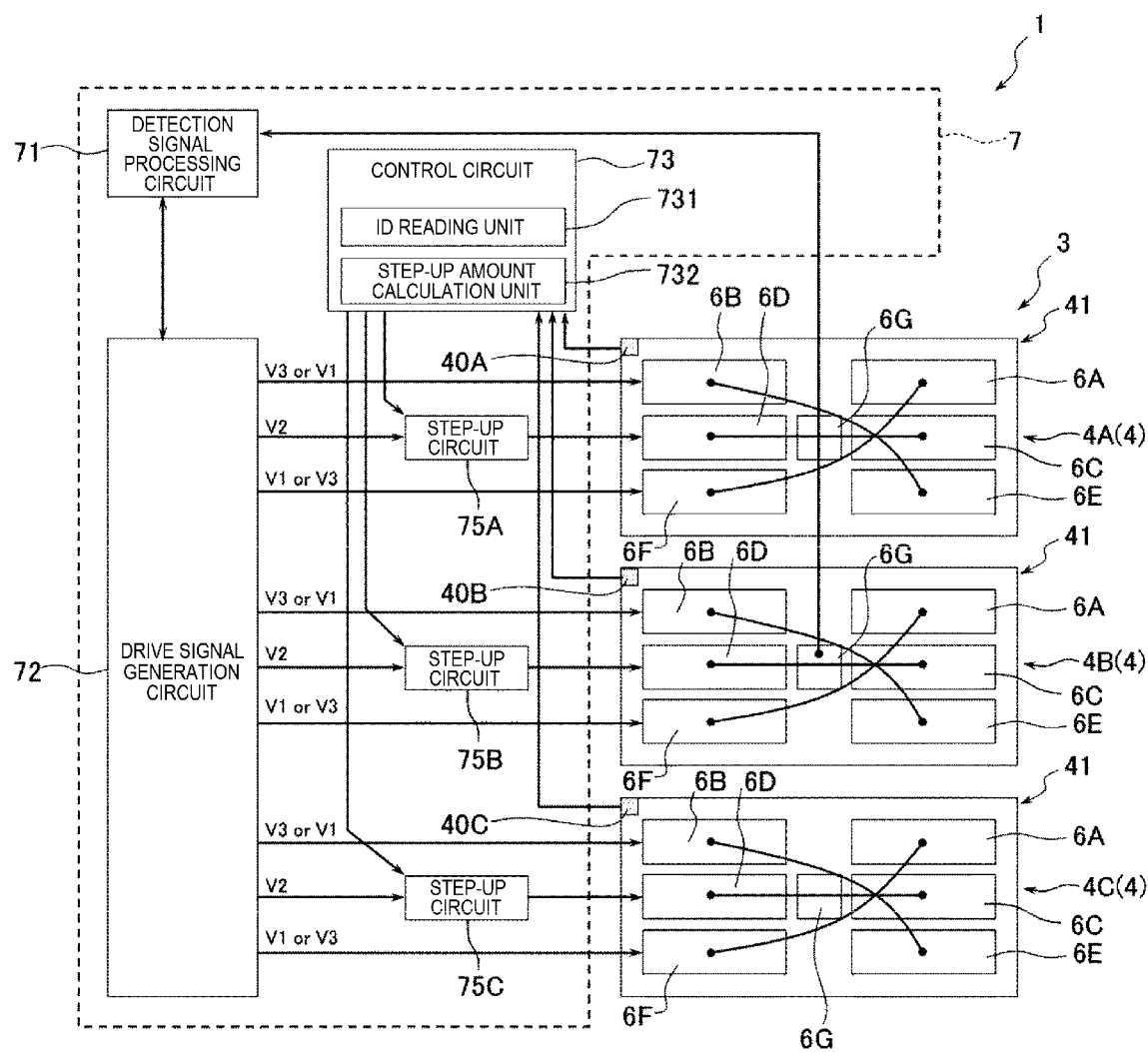
FIG. 2 is a block diagram showing the piezoelectric drive device in FIG. 1.
Figure 3:
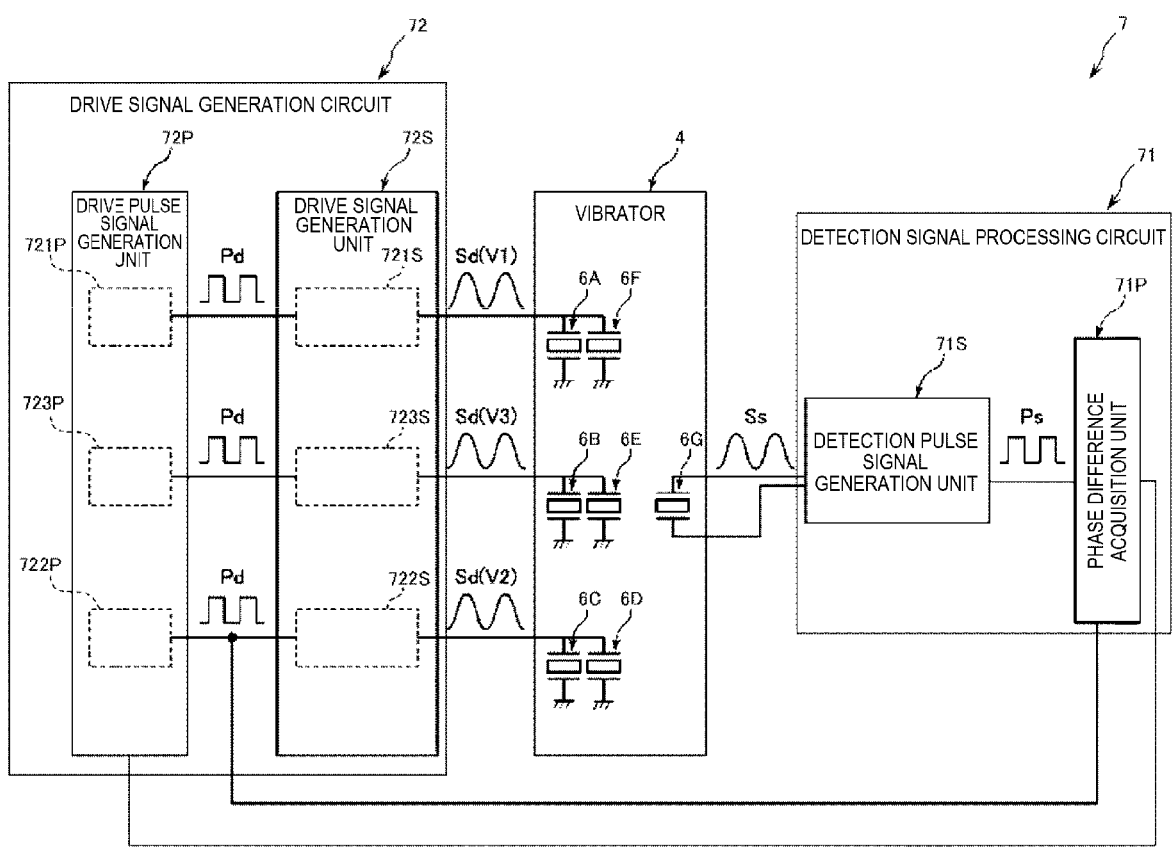
FIG. 3 is a block diagram showing a controller in FIG. 2.
Figure 4:
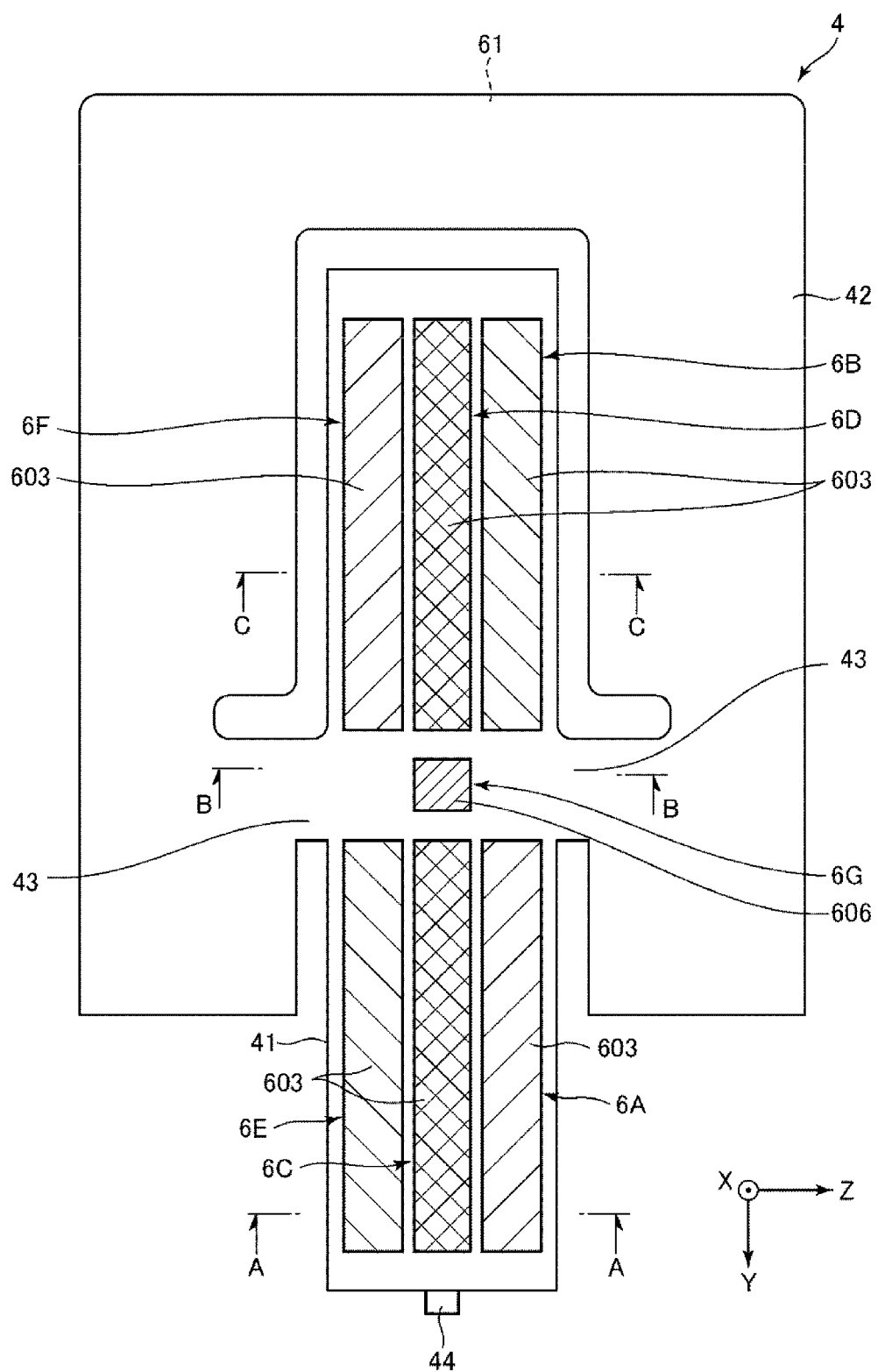
FIG. 4 is a plan view showing an arrangement of electrodes of a vibrator shown in FIG. 1.
Figure 5:
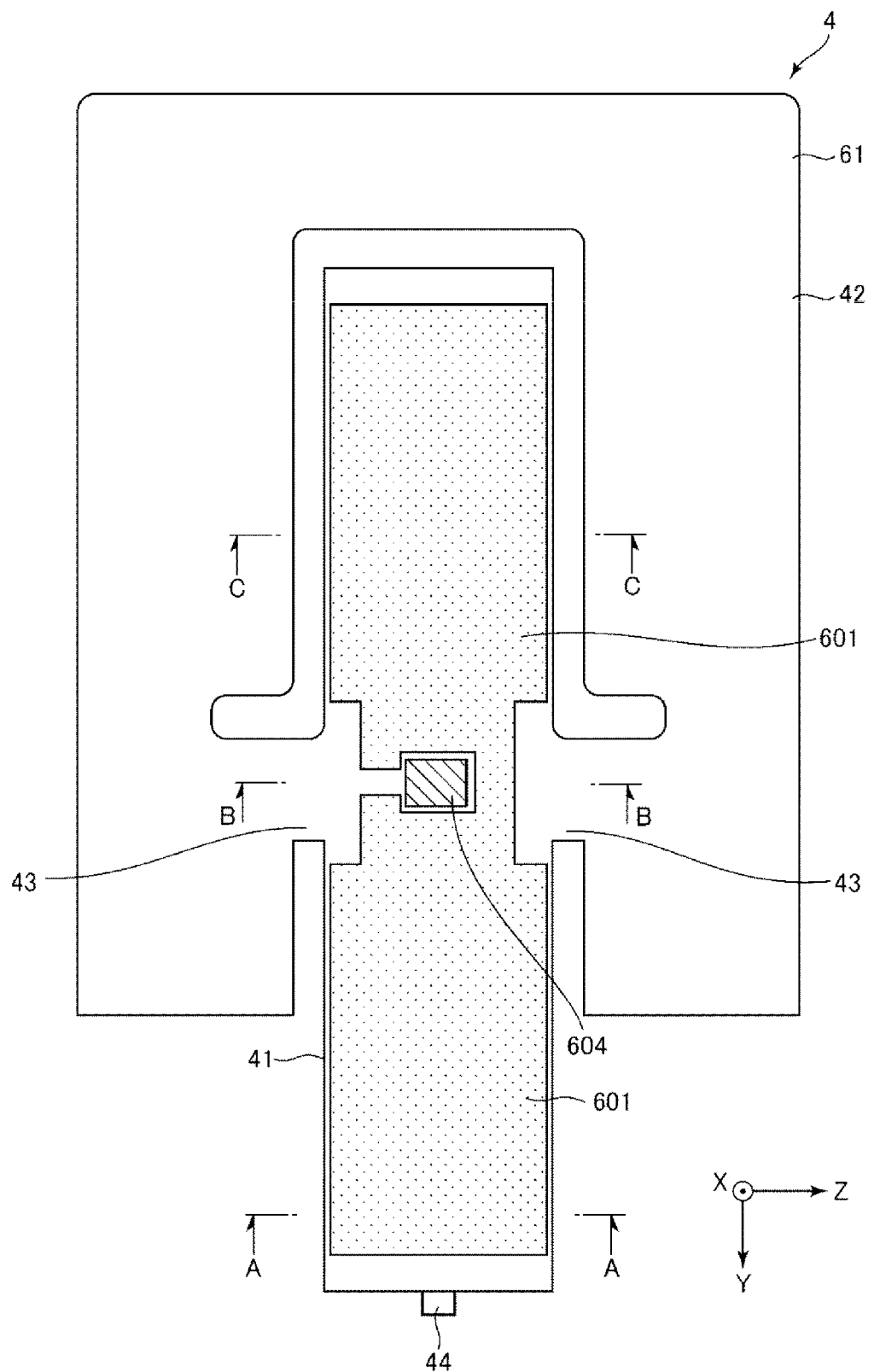
FIG. 5 is a plan view showing an arrangement of electrodes of the vibrator shown in FIG. 1.
Figure 6:
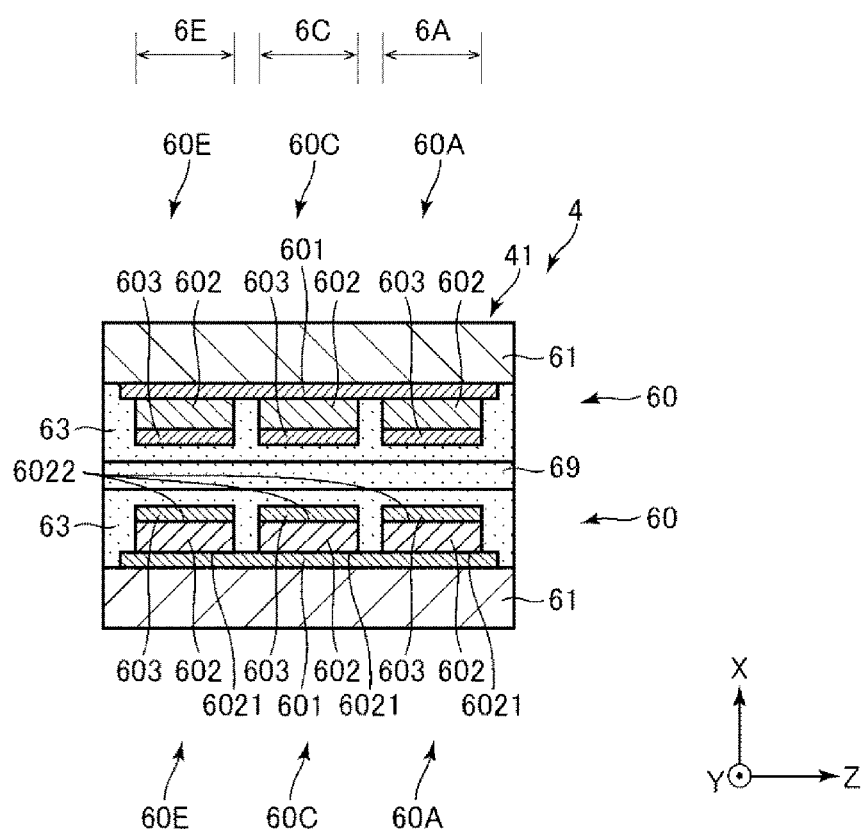
FIG. 6 is a sectional view along line A-A in FIGS. 4 and 5.
Figure 7:
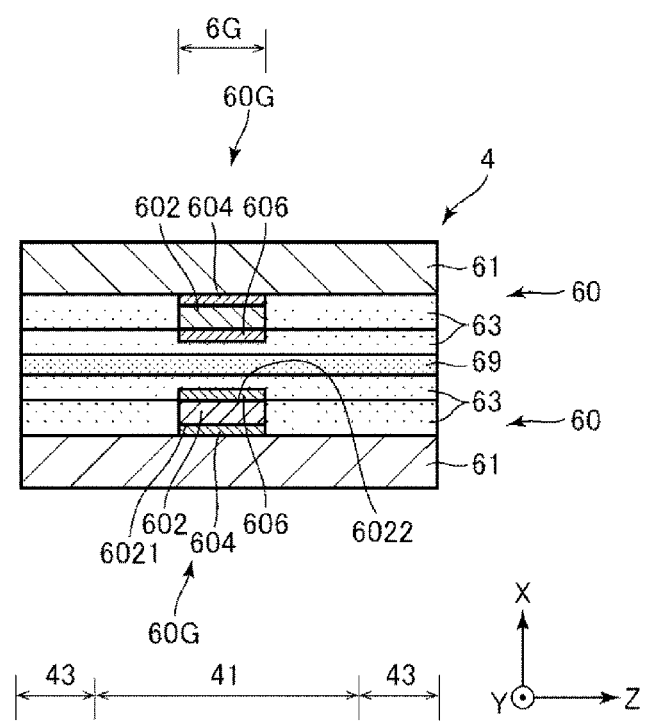
FIG. 7 is a sectional view along line B-B in FIGS. 4 and 5.
Figure 8:
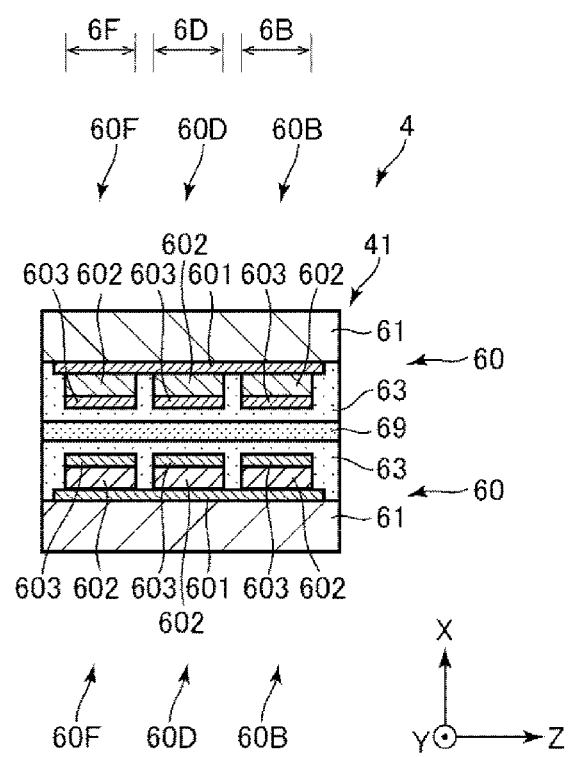
FIG. 8 is a sectional view along line C-C in FIGS. 4 and 5.
Figure 9:
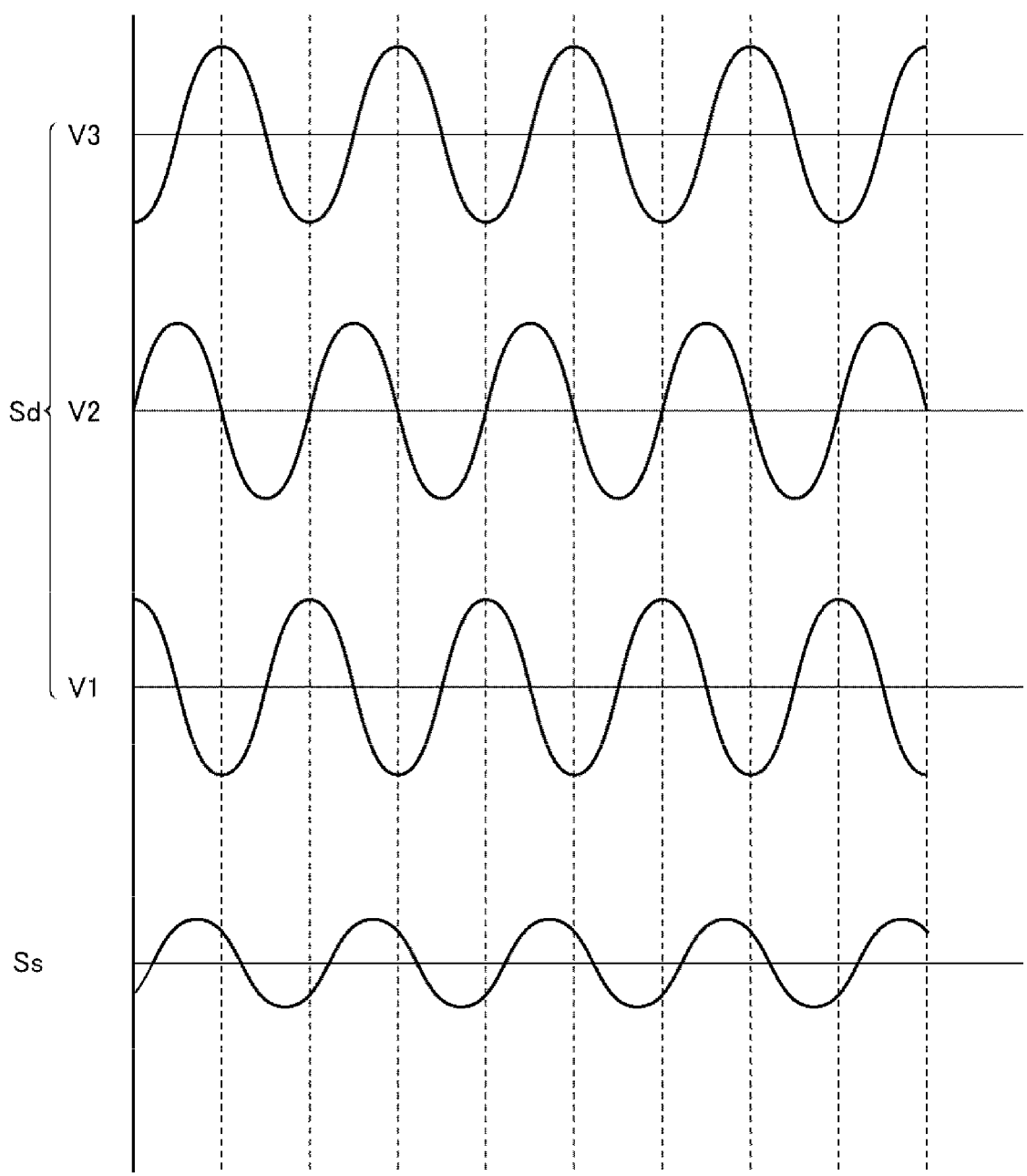
FIG. 9 shows alternating-current voltages applied to the vibrator shown in FIG. 2.
Figure 10:
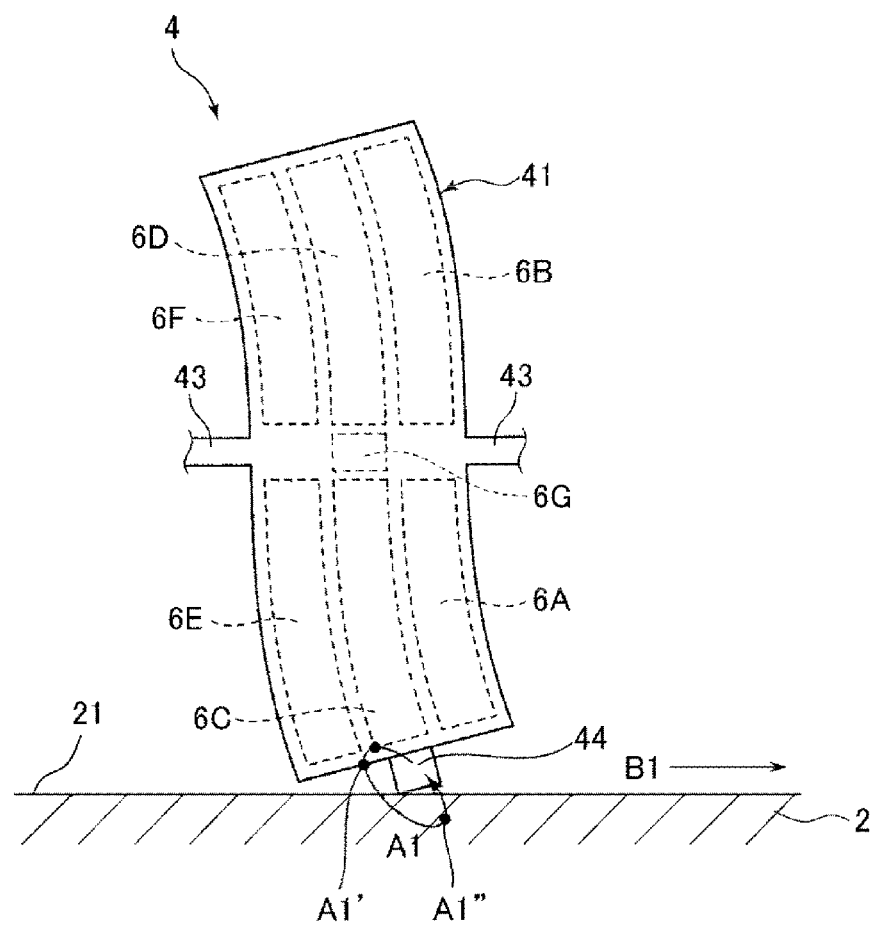
FIG. 10 shows a drive state of the vibrator shown in FIG. 1.
Figure 11:
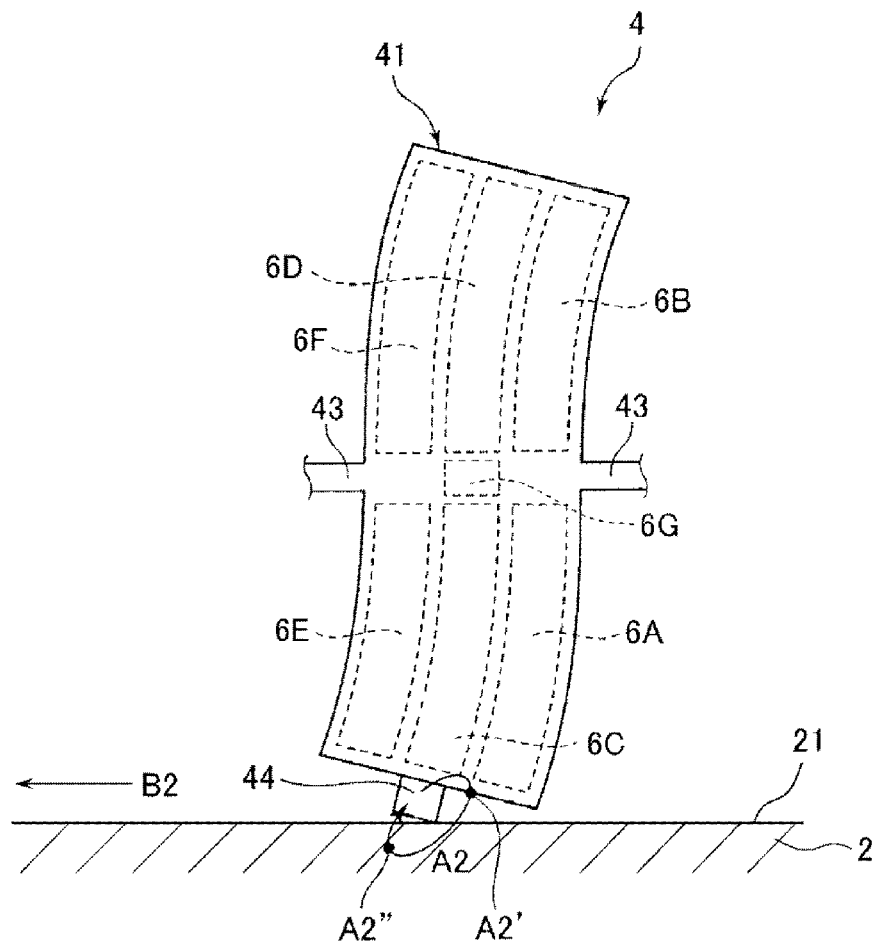
FIG. 11 shows a drive state of the vibrator shown in FIG. 1.
Figure 12:
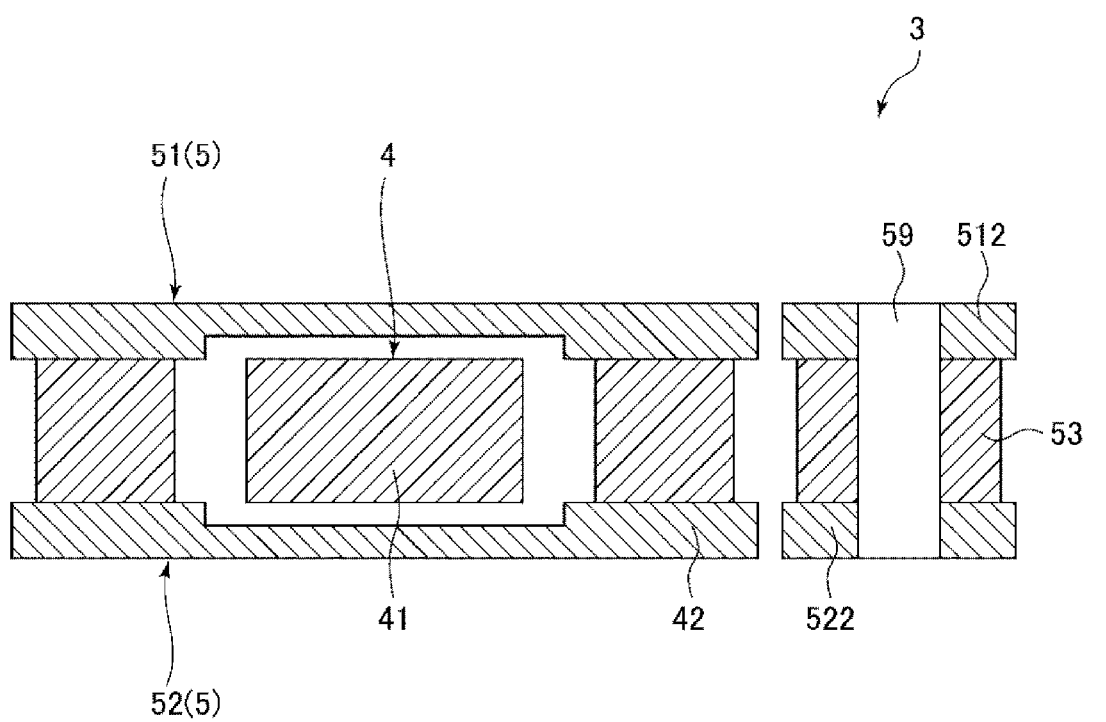
FIG. 12 is a sectional view along line E-E in FIG. 1.
Figure 12:
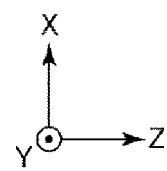

FIG. 1 is the perspective view showing the piezoelectric drive device according to the first embodiment. FIG. 2 is the block diagram showing the piezoelectric drive device in FIG. 1. FIG. 3 is the block diagram showing the controller in FIG. 2. FIGS. 4 and 5 are respectively the plan views showing the arrangements of the electrodes of the vibrator shown in FIG. 1. FIG. 6 is the sectional view along line A-A in FIGS. 4 and 5. FIG. 7 is the sectional view along line B-B in FIGS. 4 and 5. FIG. 8 is the sectional view along line C-C in FIGS. 4 and 5. FIG. 9 shows the alternating-current voltages applied to the vibrator shown in FIG. 2. FIGS. 10 and 11 respectively show the drive states of the vibrator shown in FIG. 1. FIG. 12 is the sectional view along line E-E in FIG. 1. In the following explanation, for convenience of explanation, upsides in FIGS. 6 to 8 are also referred to as "upper" and downsides are also referred to as "lower".

Hereinafter, for convenience of explanation, three axes orthogonal to one another are referred to as "X-axis", "Y-axis", and "Z-axis", and directions along the X-axis are also referred to as "X-axis directions", directions along the Y-axis are also referred to as "Y-axis directions", and directions along the Z-axis are also referred to as "Z-axis directions". Further, the pointer sides of the respective axes are also referred to as "plus sides" and the opposite sides to the pointers are also referred to as "minus sides". Furthermore, the plus side in the X-axis direction is also referred to as "upper" or "upside" and the minus side in the X-axis direction is also referred to as "lower" or "downside".

The piezoelectric drive device 1 shown in FIG. 1 has a rotor 2 (driven member) used as a rotary motor (ultrasonic motor) and being rotatable about a rotation axis O, and a vibration actuator 3 driving to rotate the rotor 2, and a controller 7 controlling driving of the vibration actuator 3. The vibration actuator 3 has a plurality of vibrators 4 and an urging member 5 that urges the respective vibrators 4 toward the rotor 2.

The rotor 2 has a circular plate shape and is journaled rotatably about the rotation axis O. The configuration of the rotor 2 is not particularly limited. In the rotor 2, the plurality of vibrators 4 are arranged in contact with an upper surface 21 thereof. Note that, in the embodiment, the three vibrators 4 are arranged, however, the number of vibrators 4 is not particularly limited, but may be two, four, or more.

Further, the controller 7 shown in FIG. 2 is configured to output drive signals Sd to the three vibrators 4.

Note that the piezoelectric drive device 1 may be used as a linear motor. In this case, the piezoelectric drive device 1 may have a slider that linearly moves by driving of the vibration actuator 3 in place of the rotor 2.

Next, the vibrator 4 will be explained. The three vibrators 4 have the same configuration and, as below, one vibrator 4 will be representatively explained and the explanation of the other vibrators 4 will be omitted.

As shown in FIGS. 4 and 5, the vibrator 4 has a vibrating portion 41 that can vibrate, a supporting portion 42 that supports the vibrating portion 41, a pair of coupling portions 43 that couple the vibrating portion 41 and the supporting portion 42, and a distal end portion 44 provided on the vibrating portion 41. The vibrating portion 41 has a substantially rectangular plate shape having a long axis in the Y-axis directions as expansion and contraction directions in plan view from the X-axis direction. The distal end portion 44 is provided at a distal end of the long axis of the vibrating portion 41. Further, the supporting portion 42 has a U-shape surrounding the proximal end side of the vibrating portion 41. Note that the shape of the vibrator 4 is not particularly limited as long as the vibrator may fulfill the function thereof.

As shown in FIG. 4, the vibrating portion 41 has driving piezoelectric elements 6A to 6F for flexural vibration of the vibrating portion 41 and a detection piezoelectric element 6G for detection of the vibration of the vibrating portion 41.

The piezoelectric elements 6C, 6D are respectively placed along the longitudinal directions (Y-axis directions) of the vibrating portion 41 in the center part of the vibrating portion 41 in the Z-axis directions. The piezoelectric element 6C is located closer to the plus side in the Y-axis direction than the piezoelectric element 6D, and the piezoelectric element 6D is located closer to the minus side in the Y-axis direction than the piezoelectric element 6C. The piezoelectric element 6G is placed between the piezoelectric element 6C and the piezoelectric element 6D. The piezoelectric element 6C and the piezoelectric element 6D are electrically coupled to each other as shown in FIGS. 2 and 4.

Note that, in place of the two piezoelectric elements 6C, 6D, a single piezoelectric element may be provided.

The piezoelectric elements 6A, 6B are placed adjacent to each other in the longitudinal directions of the vibrating portion 41 at the plus side of the vibrating portion 41 in the Z-axis direction with respect to the piezoelectric elements 6C, 6D, and the piezoelectric elements 6E, 6F are placed adjacent to each other in the longitudinal directions of the vibrating portion 41 at the minus side in the Z-axis direction. These piezoelectric elements 6A to 6F respectively expand and contract in the longitudinal directions of the vibrating portion 41 by energization. As shown in FIG. 2, the piezoelectric elements 6A, 6F are electrically coupled to each other and the piezoelectric elements 6B, 6E are electrically coupled to each other. As will be described later, alternating-current voltages in different phases from each other at the same frequency as each other are applied to the piezoelectric elements 6C, 6D, the piezoelectric elements 6A, 6F, and the piezoelectric elements 6B, 6E and the expansion and contraction times of the elements are shifted, and thereby, the vibrating portion 41 may be flexurally vibrated in S-shapes within the plane thereof.

The piezoelectric element 6G is preferably located between the piezoelectric element 6C and the piezoelectric element 6D. That is, the piezoelectric element 6G is placed adjacent to the piezoelectric elements 6C, 6D in the expansion and contraction directions thereof. An external force according to the vibration of the vibrating portion 41 with driving of the piezoelectric elements 6A to 6F is applied to the piezoelectric element 6G, and the piezoelectric element 6G outputs a signal according to the applied external force. Accordingly, the vibration state of the vibrating portion 41 may be sensed based on the signal output from the piezoelectric element 6G. Note that "the piezoelectric element 6G is placed adjacent to the piezoelectric elements 6C, 6D in the expansion and contraction directions thereof" means that at least a part of the piezoelectric element 6G is located within an area in which an area formed by extension of the piezoelectric element 6C in the expansion and contraction directions and an area formed by extension of the piezoelectric element 6D in the expansion and contraction directions overlap, and preferably means that the entire of the piezoelectric element 6G is located within the area.

Further, the piezoelectric element 6G is placed in a part as a node of the flexural vibration of the vibrating portion 41. The node of the flexural vibration is a part in which the amplitude in the Z-axis directions is substantially zero, i.e. a part in which the flexural vibration is not substantially generated. As described above, the piezoelectric element 6G is placed adjacent to the piezoelectric elements 6C, 6D in the expansion and contraction directions thereof and placed in the part containing the node of the flexural vibration of the vibrating portion 41, and thereby, the stretching vibration of the vibrating portion 41 in the Y-axis directions is easier to be transmitted to the piezoelectric element 6G and the flexural vibration of the vibrating portion 41 in the Z-axis directions is harder to be transmitted. That is, in the piezoelectric element 6G, sensitivity for the flexural vibration may be made lower while sensitivity for the stretching vibration is made higher. Accordingly, the stretching vibration of the vibrating portion 41 in the Y-axis directions may be detected with higher accuracy by the piezoelectric element 6G.

Note that the placement of the piezoelectric element 6G is not particularly limited as long as the element may detect the stretching vibration of the vibrating portion 41 in the Y-axis directions, but may be placed in a part as an antinode of the flexural vibration of the vibrating portion 41, for example. Or, the piezoelectric element 6G may be divided into a plurality of pieces.

The supporting portion 42 supports the vibrating portion 41. The supporting portion 42 has a U-shape surrounding the proximal end side, i.e., the minus side in the Y-axis direction of the vibrating portion 41 in the plan view from the X-axis direction. Note that the shape and the placement of the supporting portion 42 are not particularly limited as long as the portion may fulfill the function thereof.

The coupling portions 43 couple the part as the node of the flexural vibration of the vibrating portion 41, specifically, the center part of the vibrating portion 41 in the Y-axis directions and the supporting portion 42. Note that the configuration of the coupling portions 43 is not particularly limited as long as the portions may fulfill the function thereof.

The above described vibrating portion 41 and coupling portions 43 have a configuration formed by bonding of two piezoelectric element units 60 to face each other as shown in FIGS. 6 to 8. That is, in the sectional views shown in FIGS. 6 to 8, the configurations of the piezoelectric element units 60 have a mirror-image relationship with respect to a line passing through the midpoint of the configurations. Further, the supporting portion 42 (not shown) also has a configuration formed by bonding of two piezoelectric element units 60 to face each other. Each piezoelectric element unit 60 has a substrate 61, driving piezoelectric elements 60A, 60B, 60C, 60D, 60E, 60F and a detection piezoelectric element 60G placed on the substrate 61, and a protective layer 63 covering the respective piezoelectric elements 60A to 60G. The protective layer 63 has an insulation property and may be referred to as "insulating part". The substrate 61 is not particularly limited, but e.g. a silicon substrate may be used. In the following description, of the two piezoelectric element units 60 shown in FIGS. 6 to 8, the piezoelectric element unit 60 located at the downside in the respective drawings will be representatively explained.

As shown in FIGS. 6 to 8, each of the piezoelectric elements 60A to 60F has a first electrode 601 placed on the substrate 61, a piezoelectric material 602 placed on the first electrode 601, and a second electrode 603 placed on the piezoelectric material 602. That is, the first electrode 601 is provided on a lower surface 6021 of the piezoelectric material 602, and the second electrode 603 is provided on an upper surface 6022 of the piezoelectric material 602. The first electrodes 601, the piezoelectric materials 602, and the second electrodes 603 are respectively provided in the piezoelectric elements 60A to 60F. That is, the first electrodes 601 and the second electrodes 603 are driving electrodes that vibrate the respective piezoelectric materials 602 of the driving piezoelectric elements 60A to 60F based on drive signals.

On the other hand, as shown in FIG. 7, the piezoelectric element 60G has a third electrode 604 placed on the substrate 61, a piezoelectric material 602 placed on the third electrode 604, and a fourth electrode 606 placed on the piezoelectric material 602. That is, the third electrode 604 is provided on a lower surface 6021 of the piezoelectric material 602, and the fourth electrode 606 is provided on an upper surface 6022 of the piezoelectric material 602. The third electrode 604 is provided individually from the first electrodes 601 and the fourth electrode 606 is provided individually from the second electrodes 603. That is, the third electrode 604 and the fourth electrode 606 are detection electrodes that output detection signals according to the vibration of the piezoelectric material 602 of the detection piezoelectric element 60G to the controller 7, which will be described later.

Note that, in the embodiment, as shown in FIG. 5, the first electrodes 601 and the third electrode 604 are individual electrodes, however, these may be a single common electrode.

Further, the first electrodes 601, the second electrodes 603, the third electrode 604, and the fourth electrode 606 are electrically coupled to the controller 7 via wires (not shown). Note that FIGS. 4 and 5 are the plan views showing different layers via the piezoelectric material 602. FIG. 4 shows the layer in which the second electrodes 603 and the fourth electrode 606 are provided, and FIG. 5 shows the layer in which the first electrodes 601 and the third electrode 604 are provided.

The above described two piezoelectric element units 60 are joined via an adhesive 69 with the surfaces on which the piezoelectric elements 60A to 60G are placed facing each other. Note that the piezoelectric element unit 60 may be singly used. The number of bonded units is not limited to two, but may be three or more.

The first electrodes 601 of the respective piezoelectric elements 60A are electrically coupled via wires or the like (not shown). Further, the second electrodes 603 of the respective piezoelectric elements 60A are electrically coupled via wires or the like (not shown). These two piezoelectric elements 60A form the piezoelectric element 6A. The same applies to the other piezoelectric elements 60B to 60F, and the two piezoelectric elements 60B form the piezoelectric element 6B, the two piezoelectric elements 60C form the piezoelectric element 6C, the two piezoelectric elements 60D form the piezoelectric element 6D, the two piezoelectric elements 60E form the piezoelectric element 6E, and the two piezoelectric elements 60F form the piezoelectric element 6F.

On the other hand, the third electrodes 604 of the respective piezoelectric elements 60G are electrically coupled via wires or the like (not shown). Further, the fourth electrodes 606 of the respective piezoelectric elements 60G are electrically coupled via wires or the like (not shown). These two piezoelectric elements 60G form the piezoelectric element 6G.

The constituent material of the piezoelectric material 602 is not particularly limited, but piezoelectric ceramics including e.g. lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead scandium niobate, etc. may be used. Or, as the piezoelectric material 602, polyvinylidene fluoride, crystal quartz, or the like may be used in addition to the above described piezoelectric ceramics.

The method of forming the piezoelectric material 602 is not particularly limited, but the material may be formed from a bulk material or formed using the sol-gel method or sputtering method. In the embodiment, the piezoelectric material 602 is formed using the sol-gel method. Thereby, for example, the thinner piezoelectric material 602 is obtained compared to the case where the piezoelectric material is formed from the bulk material, and the thickness of the vibrator 4 may be reduced.

The distal end portion 44 is provided at the distal end of the vibrating portion 41 and projects from the vibrating portion 41 toward the plus side in the Y-axis direction. The distal end portion 44 is in contact with the upper surface 21 of the rotor 2. Accordingly, the vibration of the vibrating portion 41 is transmitted to the rotor 2 via the distal end portion 44. The constituent material of the distal end portion 44 is not particularly limited, but includes various kinds of ceramics such as zirconia, alumina, and titania. Thereby, the distal end portion 44 with better durability is obtained.

In the vibrator 4, when an alternating-current voltage V1 shown in FIG. 9 is applied to the piezoelectric elements 6A, 6F, an alternating-current voltage V2 is applied to the piezoelectric elements 6C, 6D, and an alternating-current voltage V3 is applied to the piezoelectric elements 6B, 6E, as shown in FIG. 10, the vibrating portion 41 flexurally vibrates in S-shapes in the Z-axis directions while stretchingly vibrating in the Y-axis directions. Concurrently, the alternating-current voltage V2 applied to the piezoelectric elements 6C, 6D generates stretching vibration in the vibrating portion 41. On the other hand, the alternating-current voltage V1 applied to the piezoelectric elements 6A, 6F and the alternating-current voltage V3 applied to the piezoelectric elements 6B, 6E generate flexural vibration in the vibrating portion 41. That is, the alternating-current voltage V2 is a stretching vibration drive signal generating the stretching vibration in the vibrating portion 41, and the alternating-current voltages V1, V3 are flexural vibration drive signals respectively generating the flexural vibration in the vibrating portion 41. When these vibrations are synthesized, the distal end of the distal end portion 44 makes elliptic motion drawing an elliptical trajectory counterclockwise as shown by an arrow A1. Therefore, the alternating-current voltages V1, V2, V3 are drive signals Sd in the piezoelectric drive device 1. The rotor 2 is sent out by the elliptic motion of the distal end portion 44, and the rotor 2 rotates in the rightward direction in FIG. 10 as shown by an arrow B1. In response to the vibration of the vibrating portion 41, a detection signal Ss is output from the piezoelectric element 6G. The frequency of the detection signal Ss is substantially equal to the frequency of the drive signal Sd.

Note that, in the elliptic motion of the distal end portion 44 shown by the arrow A1, the distal end portion 44 is in contact with the upper surface 21 of the rotor 2 and sends out the rotor 2 in the direction of the arrow B1 from a point A1' to a point A1", and the distal end portion 44 is separated from the upper surface 21 of the rotor 2 from the point A1" to the point A1'. Accordingly, the rotation of the rotor 2 toward the opposite side to the arrow B1 is suppressed from the point A1" to the point A1'.

When the alternating-current voltages V1, V3 are switched, that is, when the alternating-current voltage V1 is applied to the piezoelectric elements 6B, 6E, the alternating-current voltage V2 is applied to the piezoelectric elements 6C, 6D, and the alternating-current voltage V3 is applied to the piezoelectric elements 6A, 6F, as shown in FIG. 11, the vibrating portion 41 flexurally vibrates in S-shapes in the Z-axis directions while stretchingly vibrating in the Y-axis directions. Also, in this case, the alternating-current voltage V2 applied to the piezoelectric elements 6C, 6D generates stretching vibration in the vibrating portion 41. On the other hand, the alternating-current voltage V1 is applied to the piezoelectric elements 6B, 6E and the alternating-current voltage V3 applied to the piezoelectric elements 6A, 6F generate flexural vibration in the vibrating portion 41. When these vibrations are synthesized, the distal end portion 44 makes elliptic motion clockwise as shown by an arrow A2. The rotor 2 is sent out by the elliptic motion of the distal end portion 44, and the rotor 2 rotates in the leftward direction as shown by an arrow B2 in FIG. 11. In response to the vibration of the vibrating portion 41, the detection signal Ss is output from the piezoelectric element 6G. The frequency of the detection signal Ss is substantially equal to the frequency of the drive signal Sd.

Note that, in the elliptic motion of the distal end portion 44 shown by the arrow A2, the distal end portion 44 is in contact with the upper surface 21 of the rotor 2 and sends out the rotor 2 in the direction of the arrow B2 from a point A2' to a point A2", and the distal end portion 44 is separated from the upper surface 21 of the rotor 2 from the point A2" to the point A2'. Accordingly, the rotation of the rotor 2 toward the opposite side to the arrow B2 is suppressed from the point A2" to the point A2'.

The alternating-current voltages V1, V2, V3 according to the embodiment are equal in frequency to one another and different in phase from one another. Note that, in the embodiment, the patterns of the alternating-current voltages applied to the piezoelectric elements 6A to 6F are not particularly limited as long as the rotor 2 may be rotated at least in one direction. Or, the voltages applied to the piezoelectric elements 6A to 6F may be e.g. direct-current voltages to be intermittently applied, not the alternating-current voltages.

As described above, the vibrating portion 41 includes the piezoelectric elements 6A to 6F (driving piezoelectric elements) having the piezoelectric materials 602 and the first electrodes 601 and the second electrodes 603 provided on the piezoelectric materials 602. The stretching vibration and the flexural vibration in the vibrating portion 41 are respectively vibrations at the interface between the piezoelectric material 602 and the first electrode 601, i.e., in a planar surface parallel to the surface of the first electrode 601.

Thereby, vibration efficiency in the vibrating portion 41 becomes higher and the piezoelectric drive device 1 with lower power consumption may be realized.

Note that "parallel" in this specification has a concept referring to a state in which an angle formed by the vibration surface of the above described stretching vibration and flexural vibration and the surface of the first electrode 601 is 0° and a state in which the angle is within a range of ±5°.

The distal end portion 44 may be provided as appropriate, and another member may be substituted for the portion.

The urging member 5 is a member that urges the distal end portion 44 toward the upper surface 21 of the rotor 2. As shown in FIG. 12, the urging member 5 has a first substrate 51 located at the upper surface side, i.e., the plus side in the X-axis direction of the vibrator 4 and a second substrate 52 located at the lower surface side, i.e., the minus side in the X-axis direction of the vibrator 4. The vibrator 4 is sandwiched by the first substrate 51 and the second substrate 52. The first substrate 51 and the second substrate 52 are not particularly limited, but e.g. silicon substrates may be used.

Here, in the embodiment, the single vibrator 4 is sandwiched by the first substrate 51 and the second substrate 52, however, for example, a configuration in which a stacking structure formed by stacking a plurality of vibrators 4 is sandwiched by the first substrate 51 and the second substrate 52 may be used. Thereby, the number of vibrators 4 contained in the single piezoelectric drive device 1 increases, and the rotor 2 may be rotated with greater torque by the increase.

As shown in FIG. 12, a spacer 53 having an equal thickness to that of the vibrator 4 is provided between supporting portions 512, 522. Further, in the part, a through hole 59 penetrating in the X-axis directions is formed, and the urging member 5 is fastened by a screw to a housing or the like using the through hole 59. The urging member 5 is fastened to a housing or the like with a spring portion 513 bent in the Y-axis direction shown in FIG. 1, and thereby, the distal end portion 44 may be urged toward the upper surface 21 of the rotor 2 using the restoring force of the spring portion 513.

The configuration of the urging member 5 is not particularly limited as long as the member may urge the distal end portion 44 toward the upper surface 21 of the rotor 2. For example, one of the first substrate 51 and the second substrate 52 may be omitted. Or, for example, a coil spring, plate spring, or the like may be used as the urging member 5.

As above, the configuration of the vibrator 4 is explained, however, the configuration of the vibrator 4 is not particularly limited. For example, the supporting portion 42 and the coupling portions 43 may be omitted.

Next, the controller 7 is explained.

As shown in FIG. 2, the controller 7 has a detection signal processing circuit 71 and a drive signal generation circuit 72. Further, the controller 7 has boosting circuits 75A, 75B, 75C provided for the respective vibrators 4.

As below, the respective circuits will be explained. In FIG. 2, for convenience of explanation, the three vibrators 4 are referred to as "first piezoelectric vibrator 4A", "second piezoelectric vibrator 4B", "third piezoelectric vibrator 4C".

As shown in FIG. 3, the detection signal processing circuit 71 acquires the detection signal Ss from the vibrator 4. Then, a phase difference θ between the drive signal Sd and the detection signal Ss is detected with respect to each vibrator 4. The data of the detected phase difference θ is output to the drive signal generation circuit 72. Note that, in the embodiment, the vibrator 4 from which the detection signal Ss is acquired is the second piezoelectric vibrator 4B as shown in FIG. 2, however, may be the first piezoelectric vibrator 4A or third piezoelectric vibrator 4C, or one of the three vibrators 4 may be selected as appropriate.

As shown in FIG. 3, the detection signal processing circuit 71 includes a detection pulse signal generation unit 71S that binarizes the detection signal Ss as an analog signal output from the piezoelectric element 6G with the flexural vibration of the vibrator 4 and generates a detection pulse signal Ps as a digital signal, and a phase difference acquisition unit 71P that acquires the phase difference θ between a drive pulse signal Pd and the detection pulse signal Ps.

The drive signal generation circuit 72 acquires the data of the phase difference θ from the detection signal processing circuit 71, and changes the frequency of the drive signal Sd as needed based on the data of the phase difference θ. For example, the circuit changes the frequency of the drive signal Sd so that the phase difference θ may track a predetermined value. The phase difference θ has a correlationship with the amplitude of the vibrator 4, and the rotation state of the rotor 2 may be changed using the correlationship.

Further, as shown in FIG. 3, the drive signal generation circuit 72 according to the embodiment includes a drive pulse signal generation unit 72P that generates the drive pulse signal Pd (digital signal) for generation of the drive signal Sd, and a drive signal generation unit 72S that generates the drive signal Sd as an analog signal from the drive pulse signal Pd generated in the drive pulse signal generation unit 72P.

Of the signals, the drive pulse signal Pd generated in the drive pulse signal generation unit 72P is a rectangular wave binarized at High and Low. In the drive pulse signal generation unit 72P, the duty of the drive pulse signal Pd is changed, and thereby, the amplitude of the drive signal Sd may be changed.

Further, as shown in FIG. 3, the drive pulse signal generation unit 72P includes a first drive pulse signal generation part 721P, a second drive pulse signal generation part 722P, and a third drive pulse signal generation part 723P for generation of the alternating-current voltages V1, V2, V3 and signals in different phases.

As shown in FIG. 3, the drive signal generation unit 72S also has a first drive signal generation part 721S coupled to the first drive pulse signal generation part 721P, a second drive signal generation part 722S coupled to the second drive pulse signal generation part 722P, and a third drive signal generation part 723S coupled to the third drive pulse signal generation part 723P.

The piezoelectric drive device 1 may be driven using the above described controller 7.

Figure 13:
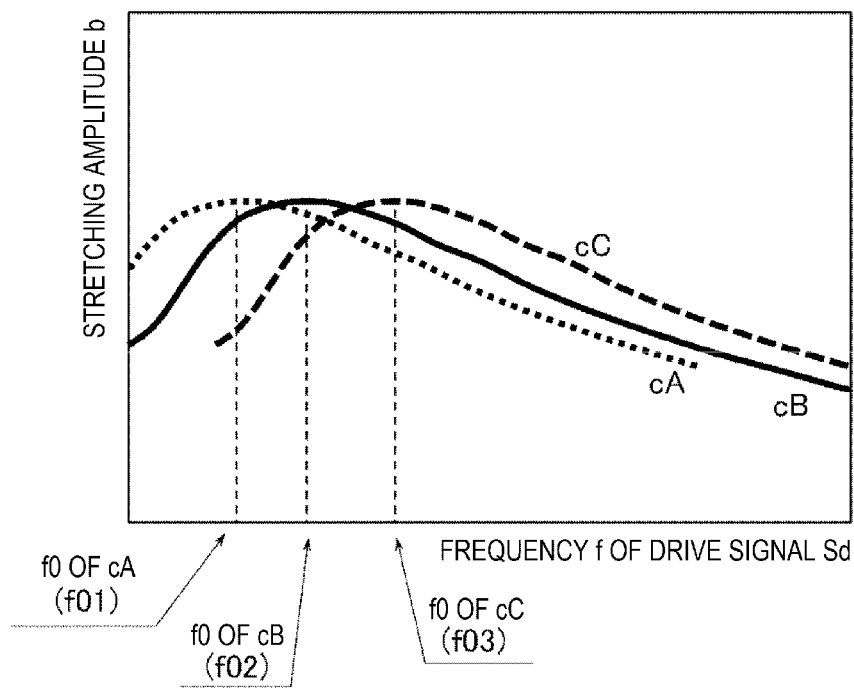
FIG. 13 is a graph showing correlationships between frequencies of drive signals and stretching amplitudes of the vibrator.

When the plurality of vibrators 4 arranged in parallel are used at the same time as is the case of the piezoelectric drive device 1 according to the embodiment, it is desirable that vibration properties of the plurality of vibrators 4 are made close to one another. For example, the vibration property may be expressed by a correlationship between the frequency f of the drive signal Sd and the expansion and contraction amplitude b of the vibrator 4. FIG. 13 is the graph showing the correlationships between the frequencies f of the drive signals Sd and the expansion and contraction amplitude b of the vibrators 4.

The vibrators 4 respectively have specific vibration properties. The specific vibration properties are based on individual differences due to e.g. manufacturing errors, environmental changes, temporal changes, etc.

As a specific example, FIG. 13 shows the vibration property cA of the first piezoelectric vibrator 4A, the vibration property cB of the second piezoelectric vibrator 4B, and the vibration property cC of the third piezoelectric vibrator 4C. The curves of the vibration properties cA, cB, cC shown in FIG. 13 shift from one another in the leftward and rightward directions in FIG. 13, and the shifts reflect the above described individual differences. When the frequency f corresponding to the peak of the curve is referred to as "resonance frequency f0", the resonance frequency f0 also shifts according to the shift of the above described curve.

There are the individual differences of the vibration properties, and thus, when the plurality of vibrators 4 are used in the piezoelectric drive device 1, if the same drive signal Sd is input, generation of stable vibration in all of the plurality of vibrators 4 is difficult.

On the other hand, the inventor found that there is a correlationship between the amplitude of the alternating-current voltage V2 and the resonance frequency f0 of the vibrator 4. As described above, the alternating-current voltage V2 is applied to the piezoelectric elements 6C, 6D and generates stretching vibration of the vibrating 41, i.e., vibration of the vibrating 41 expanding and contracting in the longitudinal directions.

Accordingly, in the embodiment, the amplitude of the alternating-current voltage V2 as a stretching vibration drive signal is changed as appropriate based on the above described correlationships, and thereby, the vibration properties cA, cB, cC are adjusted. The adjustment is made with respect to each vibrator 4, and adjustment to equalize the shifts of the above described vibration properties, i.e., the shifts of the resonance frequencies f0 can be made. Thereby, even when the common drive signal generation circuit 72 is used for the plurality of vibrators 4, stable vibration can be generated in the plurality of vibrators 4. As a result, the vibration actuator 3 may be stably driven with the simplified circuit configuration.

Figure 14:
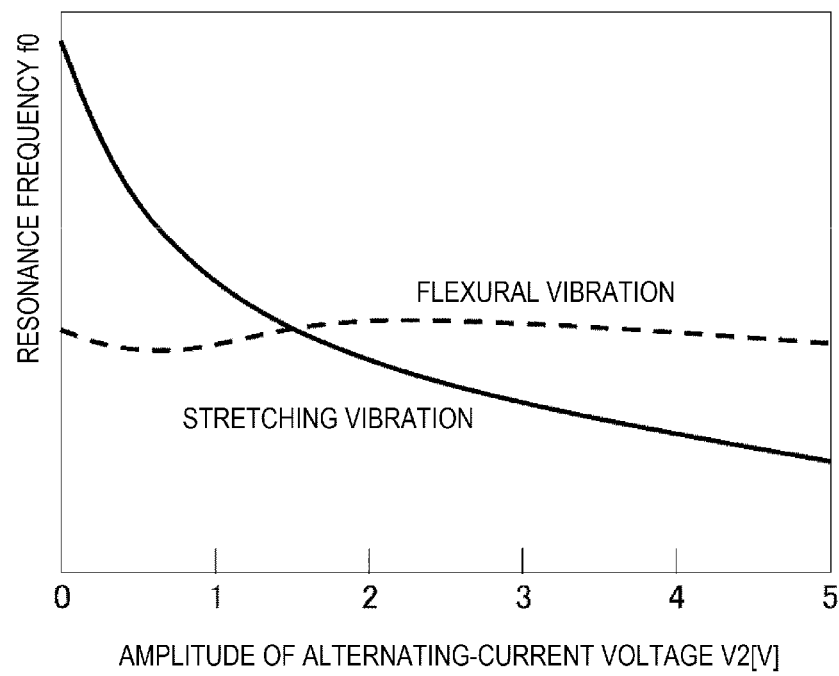
FIG. 14 is a graph showing relationships between amplitude of an alternating-current voltage of the drive signal and respective resonance frequencies of stretching vibration and flexural vibration of the vibrator.

FIG. 14 is the graph showing the relationships between the amplitude of the alternating-current voltage V2 and the respective resonance frequencies f0 of the stretching vibration and the flexural vibration of the vibrator 4. As shown in FIG. 14, the resonance frequency f0 of the stretching vibration is lower as the amplitude of the alternating-current voltage V2 is larger. On the other hand, the resonance frequency f0 of the flexural vibration is substantially constant even when the amplitude of the alternating-current voltage V2 is larger.

In consideration of the characteristics of the stretching vibration, when the amplitude of the alternating-current voltage V2 is made different with respect to each vibrator 4, that is, the alternating-current voltage V2 is stepped up, the resonance frequency f0 of the stretching vibration may be changed based on the amplitude of the alternating-current voltage V2. Thereby, adjustment of making the resonance frequencies f0 of the stretching vibration close to one another can be made, and thus, the above described vibration properties cA, cB, cC can be made close to one another. As a result, even when the common drive signal generation circuit 72 is coupled to the first piezoelectric vibrator 4A, the second piezoelectric vibrator 4B, and the third piezoelectric vibrator 4C, the vibrators may respectively generate stable vibration.

The control is realized by the controller 7 according to the embodiment. The controller 7 according to the embodiment has a control circuit 73 shown in FIG. 2 in addition to the above described detection signal processing circuit 71 and drive signal generation circuit 72. The control circuit 73 shown in FIG. 2 includes an ID reading unit 731 and a boosting amount calculation unit 732.

The ID reading unit 731 has a function of reading specific information of the respective vibrators 4, i.e., IDs. Specifically, the ID reading unit 731 has the functions of respectively accessing an ID memory unit 40A of the first piezoelectric vibrator 4A, an ID memory unit 40B of the second piezoelectric vibrator 4B, and an ID memory unit 40C of the third piezoelectric vibrator 4C and of reading the stored IDs.

In the ID memory unit 40A, information on the individual difference of the first piezoelectric vibrator 4A is stored as the ID. Specifically, in addition to information representing the resonance frequency f0 specific to the first piezoelectric vibrator 4A or indirect information from which the information may be derived, information representing the amplitude of the alternating-current voltage V2 to be applied for adjustment to a target resonance frequency or indirect information from which the information may be derived etc. is stored as the ID.

Similarly, various kinds of information specific to the second piezoelectric vibrator 4B is stored as the ID in the ID memory unit 40B, and various kinds of information specific to the third piezoelectric vibrator 4C is stored as the ID in the ID memory unit 40C.

Note that the resonance frequency f0 or the information from which the frequency may be derived is not particularly limited to, but includes e.g. numeric values obtained in advance under known conditions.

When the ID reading unit 731 accesses the information stored in the ID memory units 40A, 40B, 40C, the stored information is read. The read information is output to the boosting amount calculation unit 732.

The ID memory units 40A, 40B, 40C are not particularly limited as long as the units may store various kinds of information, however, include e.g. memory devices such as ROMs (Read only memories) or RAMS (Random Access Memories), barcodes such as one-dimensional barcodes or two-dimensional barcodes, holograms, character strings, signs, patterns, etc. Further, the memory format is not particularly limited, but may be any format reproduceable in the ID reading unit 731.

On the other hand, the ID reading unit 731 is not particularly limited as long as the unit may read various kinds of information stored in the ID memory units 40A, 40B, 40C.

The boosting amount calculation unit 732 acquires the information read by the ID reading unit 731, and then, converts the information as appropriate. Then, in the boosting amount calculation unit 732, the boosting amounts of the alternating-current voltages V2 applied to the respective vibrators 4 are calculated so that the vibration properties of the respective vibrators 4 may be close to one another based on the read information.

As an example, it is assumed that a resonance frequency f01 of the first piezoelectric vibrator 4A is stored in the ID memory unit 40A, a resonance frequency f02 of the second piezoelectric vibrator 4B is stored in the ID memory unit 40B, and a resonance frequency f03 of the third piezoelectric vibrator 4C is stored in the ID memory unit 40C. In this case, in the boosting amount calculation unit 732, the boosting amount of the alternating-current voltage V2 applied to the first piezoelectric vibrator 4A, the boosting amount of the alternating-current voltage V2 applied to the second piezoelectric vibrator 4B, and the boosting amount of the alternating-current voltage V2 applied to the third piezoelectric vibrator 4C are calculated so that these resonance frequencies f01, f02, f03 may be close to one another by checking against the correlationships shown in FIG. 14 stored in advance. Note that the boosting amount may be zero, or negative, i.e., a step-down amount. That is, the boosting in this specification has a concept including step-down as negative boosting. In the following description, the resonance frequencies f01, f02, f03 may be referred to as "resonance frequencies f0" without distinction.

As described above, the controller 7 has the boosting circuit 75A (first boosting circuit) provided between the drive signal generation circuit 72 and the piezoelectric elements 6C, 6D of the first piezoelectric vibrator 4A, the boosting circuit 75B (second boosting circuit) provided between the drive signal generation circuit 72 and the piezoelectric elements 6C, 6D of the second piezoelectric vibrator 4B, and the boosting circuit 75C (third boosting circuit) provided between the drive signal generation circuit 72 and the piezoelectric elements 6C, 6D of the third piezoelectric vibrator 4C.

The respective boosting amounts calculated in the boosting amount calculation unit 732 are output to the boosting circuits 75A, 75B, 75C. Thereby, in the boosting circuits 75A, 75B, 75C, the alternating-current voltages V2 are stepped up based on the calculated boosting amounts. As a result, the respective vibration properties of the first piezoelectric vibrator 4A, the second piezoelectric vibrator 4B, and the third piezoelectric vibrator 4C can be made close to one another. Consequently, even when the alternating-current voltages V2 (drive signals Sd) having the same amplitude as one another are output to the three vibrators 4 from the common drive signal generation circuit 72, the boosting amounts of the alternating-current voltages V2 are appropriately adjusted in the boosting circuits 75A, 75B, 75C, and thereby, stable vibration may be generated in any of the three vibrators 4. Further, good performance may be offered in the entire of the piezoelectric drive device 1. The common drive signal generation circuit 72 is used and the three vibrators 4 can be driven using the same drive signal Sd before boosting, and thus, the piezoelectric drive device 1 that can stably drive with higher output and that is easily downsized is obtained.

Figure 15:
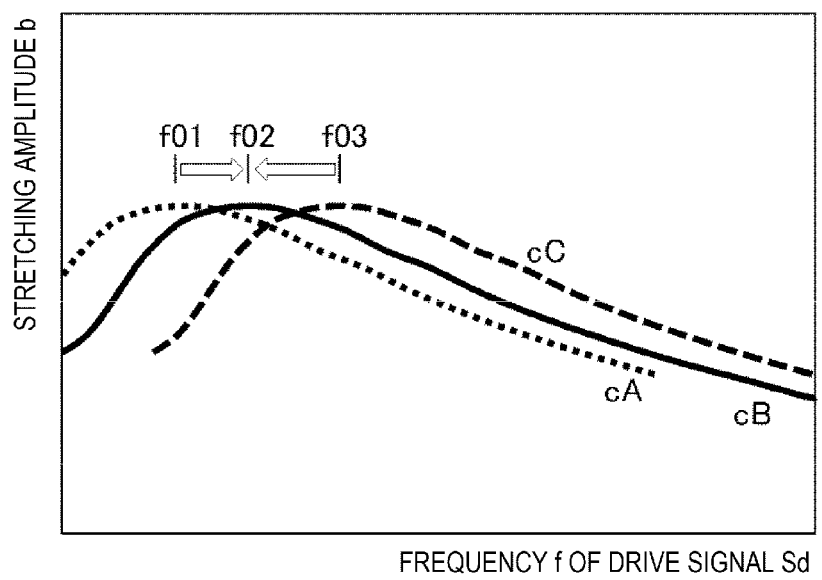
FIG. 15 is a diagram for explanation of a concept of control to make a vibration property of a first piezoelectric vibrator, a vibration property of a second piezoelectric vibrator, and a vibration property of a third piezoelectric vibrator close to one another.

FIG. 15 is the diagram for explanation of the concept of the control to make the vibration property cA of the first piezoelectric vibrator 4A, the vibration property cB of the second piezoelectric vibrator 4B, and the vibration property cC of the third piezoelectric vibrator 4C close to one another in the graph shown in FIG. 13. In FIG. 15, as a specific example, the control to respectively make the vibration property cA and the vibration property cC close to the vibration property cB is explained.

In the example of FIG. 15, first, in the ID reading unit 731, the resonance frequency f01 of the first piezoelectric vibrator 4A is read. Then, in the boosting amount calculation unit 732, a difference between the read resonance frequency f01 and the resonance frequency f02 as a target frequency is calculated. Then, the boosting amount of the alternating-current voltage V2 applied to the first piezoelectric vibrator 4A is calculated by checking the calculated difference against the correlationship shown in FIG. 14. Thus calculated boosting amount is input to the boosting circuit 75A and the alternating-current voltage V2 is stepped up.

Similarly, in the ID reading unit 731, the resonance frequency f02 of the second piezoelectric vibrator 4B is read. Then, in the boosting amount calculation unit 732, a difference between the read resonance frequency f02 and the resonance frequency f02 as the target frequency is calculated. In this example, the difference is zero, and the boosting amount of the alternating-current voltage V2 applied to the second piezoelectric vibrator 4B is also zero.

Similarly, in the ID reading unit 731, the resonance frequency f03 of the third piezoelectric vibrator 4C is read. Then, in the boosting amount calculation unit 732, a difference between the read resonance frequency f03 and the resonance frequency f02 as the target frequency is calculated. Then, the boosting amount of the alternating-current voltage V2 applied to the third piezoelectric vibrator 4C is calculated by checking the calculated difference against the correlationship shown in FIG. 14. Thus calculated boosting amount is input to the boosting circuit 75C and the alternating-current voltage V2 is stepped up.

In the above described manner, as shown in FIG. 15, the resonance frequencies f0, f3 may respectively be made close to the resonance frequency f02, and the vibration property cA and the vibration property cC may respectively be made close to the vibration property cB.

Note that, in FIG. 15, the example of the control to respectively make the resonance frequencies f0, f3 close to the resonance frequency f02 is shown, however, the control method is not limited to that. For example, the target frequency may be the resonance frequency f01 or the resonance frequency f03, or may be another arbitrary target value than the resonance frequencies f01, f02, f03.

As described above, the piezoelectric drive device 1 according to the embodiment has the first piezoelectric vibrator 4A, the second piezoelectric vibrator 4B, and the third piezoelectric vibrator 4C including the vibrating portions 41 and the distal end portions 44 placed on the vibrating portions 41, in which the distal end portions 44 make elliptic motion by the stretching vibration and the flexural vibration of the vibrating portions 41, the rotor 2 (driven member) driven by the elliptic motion of the distal end portions 44, the drive signal generation circuit 72 that outputs the alternating-current voltage V2 (stretching vibration drive signal) and the alternating-current voltages V1, V3 (flexural vibration drive signals) to the first piezoelectric vibrator 4A, the second piezoelectric vibrator 4B, and the third piezoelectric vibrator 4C, the boosting circuit 75A (first boosting circuit) provided between the first piezoelectric vibrator 4A and the drive signal generation circuit 72, the boosting circuit 75B (second boosting circuit) provided between the second piezoelectric vibrator 4B and the drive signal generation circuit 72, and the boosting circuit 75C (third boosting circuit) provided between the third piezoelectric vibrator 4C and the drive signal generation circuit 72.

Further, the piezoelectric drive device 1 has the control circuit 73 that respectively controls the boosting amount of the alternating-current voltage V2 in the boosting circuit 75A, the boosting amount of the alternating-current voltage V2 in the boosting circuit 75B, and the boosting amount of the alternating-current voltage V2 in the boosting circuit 75C. The control circuit 73 controls the resonance frequency f01 of the first piezoelectric vibrator 4A, the resonance frequency f02 of the second piezoelectric vibrator 4B, and the resonance frequency f03 of the third piezoelectric vibrator 4C to be close to one another.

According to the piezoelectric drive device 1, even when the same drive signal Sd is output from the single drive signal generation circuit 72 to the three vibrators 4 of the first piezoelectric vibrator 4A, the second piezoelectric vibrator 4B, and the third piezoelectric vibrator 4C, stable driving can be performed by the subsequent control of the boosting amounts. Accordingly, the piezoelectric drive device 1 that can stably drive with higher output and that is easily downsized is obtained.

As described above, the first piezoelectric vibrator 4A, the second piezoelectric vibrator 4B, and the third piezoelectric vibrator 4C include the respective memory units, i.e., the ID memory units 40A, 40B, 40C. Further, as described above, the control circuit 73 obtains the boosting amount of the alternating-current voltage V2 in the boosting circuit 75A (first boosting circuit), the boosting amount of the alternating-current voltage V2 in the boosting circuit 75B (second boosting circuit), and the boosting amount of the alternating-current voltage V2 in the boosting circuit 75C (third boosting circuit) based on the specific information of the first piezoelectric vibrator 4A stored in the ID memory unit 40A (first memory unit), the specific information of the second piezoelectric vibrator 4B stored in the ID memory unit 40B (second memory unit), and the specific information of the third piezoelectric vibrator 4C stored in the ID memory unit 40C (third memory unit).

According to the control circuit 73, variations of the vibration properties based on the individual differences of the respective vibrators 4, i.e., variations of the resonance frequencies f0 may be easily known based on the specific information accompanying the respective vibrators 4. Then, in the boosting amount calculation unit 732, the boosting amounts in the respective boosting circuits 75A, 75B, 75C may be easily obtained based on these variations of the resonance frequencies f0. Therefore, the circuit configuration of the control circuit 73 is simpler and the size and cost of the piezoelectric drive device 1 may be reduced.

Note that the controller 7 includes a computer having e.g. a processor such as a CPU, memory, interface, etc. The processor executes predetermined programs stored in the memory, and thereby, controls actions of the respective parts. Note that the programs may be externally downloaded via the interface. All or part of the configurations of the controller 7 may be provided outside the piezoelectric drive device 1 and connected via a communication network such as a LAN (local area network).

Second Embodiment

Next, a piezoelectric drive device according to the second embodiment will be explained.

Figure 16:
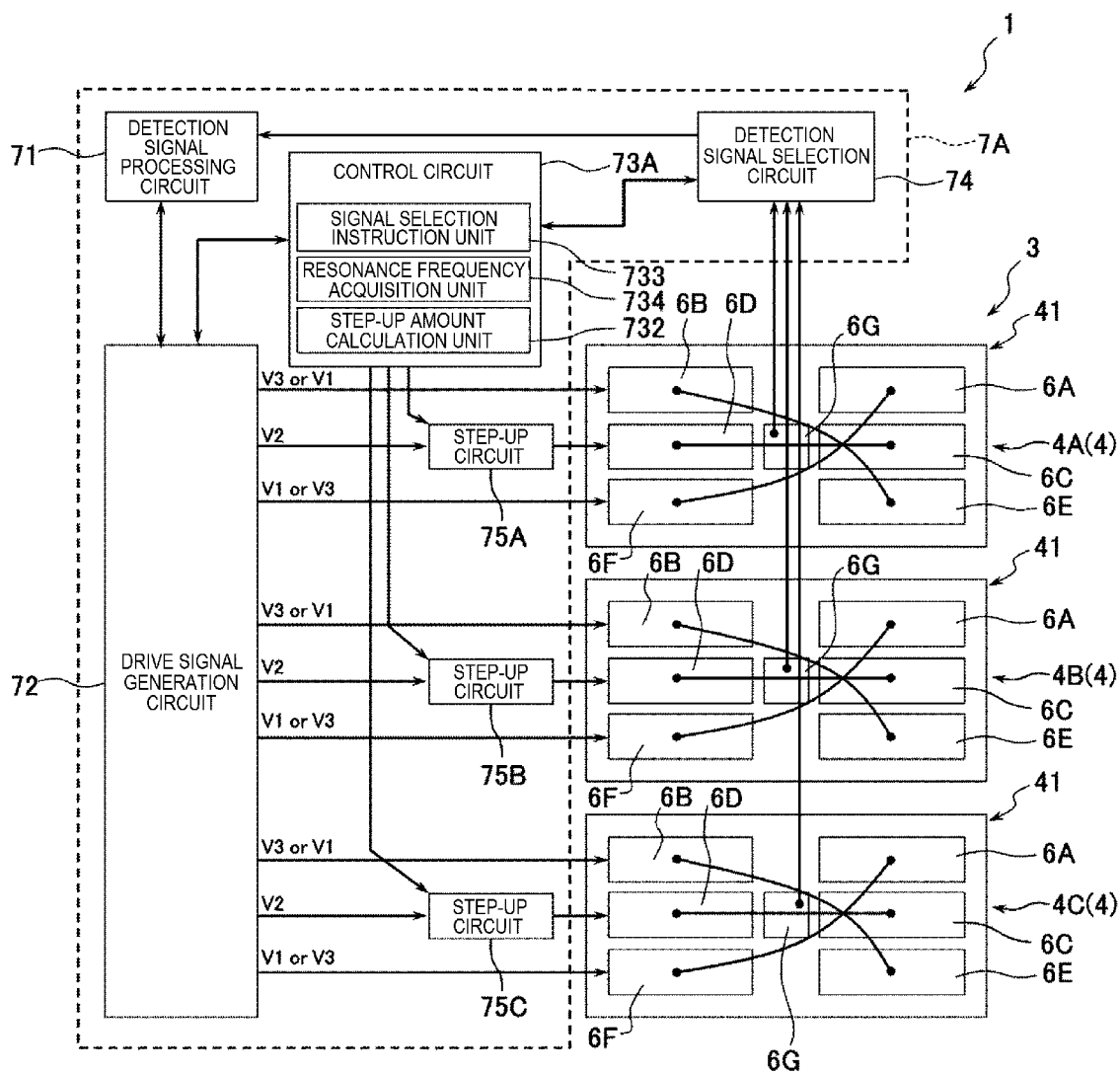
FIG. 16 is a block diagram showing a controller of a piezoelectric drive device according to a second embodiment.

FIG. 16 is the block diagram showing the controller of the piezoelectric drive device according to the second embodiment.

As below, the second embodiment will be explained with a focus on differences from the above described embodiment and the explanation of the same items will be omitted. Note that, in FIG. 16, the same configurations as those of the above described embodiment have the same signs.

The second embodiment is the same as the first embodiment except that the configuration of the controller is different.

A controller 7A shown in FIG. 16 has the detection signal processing circuit 71, the drive signal generation circuit 72, a control circuit 73A, and a detection signal selection circuit 74.

The detection signal selection circuit 74 is electrically coupled to the respective piezoelectric elements 6G of the first piezoelectric vibrator 4A, the second piezoelectric vibrator 4B, and the third piezoelectric vibrator 4C, and individually acquires the detection signals Ss from the respective piezoelectric elements 6G. Then, the acquired detection signals Ss are output to the detection signal processing circuit 71. On the other hand, a signal selection instruction as to which of the first piezoelectric vibrator 4A, the second piezoelectric vibrator 4B, and the third piezoelectric vibrator 4C outputs the detection signal Ss from the control circuit 73A is input to the detection signal selection circuit 74. In the detection signal selection circuit 74, signal selection is executed based on the instruction.

The control circuit 73A includes a signal selection instruction unit 733, a resonance frequency acquisition unit 734, and the boosting amount calculation unit 732.

The signal selection instruction unit 733 outputs the signal selection instruction to the above described detection signal selection circuit 74. Thereby, the control circuit 73A may selectively acquire the detection signal Ss of the target vibrator 4 of the plurality of vibrators 4.

As will be described later, the resonance frequency acquisition unit 734 obtains the resonance frequencies f0 of the respective vibrators 4 using the detection signal Ss output from the detection signal selection circuit 74 and the drive signal Sd acquired from the drive signal generation circuit 72. Then, the unit outputs the obtained resonance frequencies f0 to the boosting amount calculation unit 732.

Note that, as described above, the vibrating portion 41 includes the piezoelectric element 6G (detection piezoelectric element) that detects the vibration of the piezoelectric material 602. Further, the piezoelectric drive device 1 according to the embodiment has the detection signal selection circuit 74 that selectively acquires the detection signal Ss (first detection signal) from the first piezoelectric vibrator 4A, the detection signal Ss (second detection signal) from the second piezoelectric vibrator 4B, or the detection signal Ss (third detection signal) from the third piezoelectric vibrator 4C.

According to the piezoelectric drive device 1, even when only one detection signal processing circuit 71 for processing of the detection signal Ss and only one resonance frequency acquisition unit 734, which will be described later, are provided for the plurality of vibrators 4, for example, the detection signals Ss from the respective vibrators 4 may time-divisionally be acquired and processed. Thereby, with the increased output of the piezoelectric drive device 1 by using the plurality of vibrators 4, upsizing of the device may be suppressed.

Further, the control circuit 73A according to the embodiment includes the resonance frequency acquisition unit 734 that obtains the resonance frequency f01 of the first piezoelectric vibrator 4A, the resonance frequency f02 of the second piezoelectric vibrator 4B, the resonance frequency f03 of the third piezoelectric vibrator 4C based on the alternating-current voltage V2, the detection signal Ss (first detection signal) from the first piezoelectric vibrator 4A, the detection signal Ss (second detection signal) from the second piezoelectric vibrator 4B, and the detection signal Ss (third detection signal) from the third piezoelectric vibrator 4C.

Furthermore, the control circuit 73A includes the boosting amount calculation unit 732 that obtains the boosting amount of the alternating-current voltage V2 in the boosting circuit 75A (first boosting circuit), the boosting amount of the alternating-current voltage V2 in the boosting circuit 75B (second boosting circuit), and the boosting amount of the alternating-current voltage V2 in the boosting circuit 75C (third boosting circuit) based on the resonance frequency f01, the resonance frequency f02, and the resonance frequency f03.

According to the control circuit 73A, unlike the first embodiment in which the resonance frequencies f0 are acquired from the IDs accompanying the respective vibrators 4, the resonance frequencies f0 specific to the respective vibrators 4 may be acquired at arbitrary times. Then, like the first embodiment, the boosting amounts of the alternating-current voltages V2 applied to the respective vibrators 4 may be appropriately changed based on the acquired resonance frequencies f0.

Figure 17:
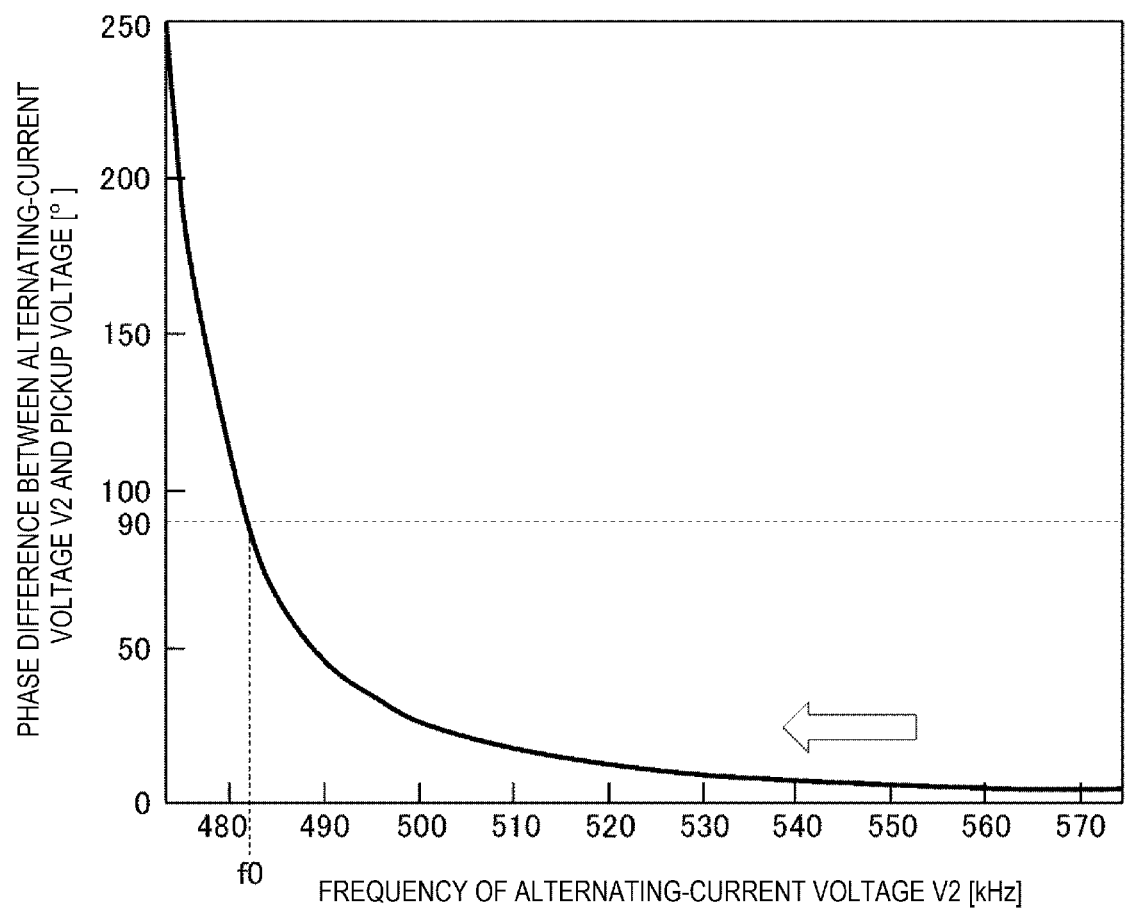
FIG. 17 is a diagram for explanation of a method of obtaining resonance frequencies of the respective vibrators in the controller shown in FIG. 16.

Next, a control method of the piezoelectric drive device 1 using the controller 7A shown in FIG. 16 will be explained. FIG. 17 is the diagram for explanation of the method of obtaining the resonance frequencies f0 of the respective vibrators 4 in the controller 7A shown in FIG. 16.

First, the signal selection instruction is output toward the detection signal selection circuit 74 by the signal selection instruction unit 733. In response to the instruction, in the detection signal selection circuit 74, one of the first piezoelectric vibrator 4A, the second piezoelectric vibrator 4B, and the third piezoelectric vibrator 4C is selected for electrical coupling to the piezoelectric element 6G of the vibrator. In this regard, it is advantageous that time-divisional sequential coupling is instructed not to cause overlapping between coupling times for the respective vibrators 4 because parallelization of the circuit is unnecessary.

Then, a drive signal output instruction is output from the resonance frequency acquisition unit 734 toward the drive signal generation circuit 72. The drive signal here is only the alternating-current voltage V2 for the piezoelectric elements 6C, 6D. That is, the alternating-current voltages V1, V3 are not applied. Then, as shown by an arrow in FIG. 17, the unit instructs down-sweep of the frequency of the applied alternating-current voltage V2. Then, the resonance frequency acquisition unit 734 acquires a voltage output from the piezoelectric element 6G in the process of the down-sweep, i.e., a pickup voltage via the detection signal selection circuit 74.

FIG. 17 shows the graph indicating the relationship between the frequency of thus obtained alternating-current voltage V2 and a phase difference between the frequency of the alternating-current voltage V2 and the frequency of the pickup voltage. As shown in FIG. 17, a curve in which, when the phase difference is obtained while the alternating-current voltage V2 is lowered, the phase difference is gradually larger may be obtained.

In the resonance frequency acquisition unit 734, the frequency of the alternating-current voltage V2 when the phase difference is 90° is obtained based on the relationship. Thus obtained frequency is used as the resonance frequency f0 of the vibrator 4. Note that the method of obtaining the resonance frequency f0 is not limited to that. For example, the resonance frequency is not obtained based on the phase difference, but the frequency at which the pickup voltage has a peak may be obtained as the resonance frequency f0 of the vibrator 4.

The amplitude of the alternating-current voltage V2 when the resonance frequency f0 is obtained in the above described manner is not particularly limited. For example, the amplitude is set to a voltage contained in the horizontal axis shown in FIG. 14. In the case of the graph shown in FIG. 14, the amplitude is set to e.g. 2 V.

In the above described manner, the respective resonance frequencies f0 may be obtained for the first piezoelectric vibrator 4A, the second piezoelectric vibrator 4B, and the third piezoelectric vibrator 4C. The resonance frequencies f0 are derived as needed, and thereby, the resonance frequencies f0 may be updated to the latest values. The updated resonance frequencies f0 are output to the boosting amount calculation unit 732.

Subsequently, like the first embodiment, the boosting amounts of the alternating-current voltages V2 applied to the respective vibrators 4 are calculated based on the resonance frequencies f0 of the respective vibrators 4 in the boosting amount calculation unit 732. Then, in the boosting circuits 75A, 75B, 75C, the alternating-current voltages V2 are stepped up based on the calculated boosting amounts. As a result, the respective vibration properties of the first piezoelectric vibrator 4A, the second piezoelectric vibrator 4B, and the third piezoelectric vibrator 4C can be made close to one another. Consequently, even when the same drive signal Sd is output, stable vibration may be generated in any of the three vibrators 4 by the subsequent control of the boosting amounts. Then, good performance may be offered in the entire of the piezoelectric drive device 1.

Particularly, in the embodiment, the resonance frequencies f0 of the respective vibrators 4 may be updated to the latest values. Accordingly, even when the resonance frequencies f0 of the respective vibrators 4 are changed due to e.g. environmental changes, temporal changes, or the like, the changes may be reflected on the boosting amounts and stable vibration may be maintained.

Further, it is preferable that update processing of the resonance frequencies f0 and the reflection processing to the boosting amounts, i.e., the processing by the resonance frequency acquisition unit 734 and the processing by the boosting amount calculation unit 732 are executed at predetermined times (on a regular basis). Thereby, the resonance frequencies f0 of the respective vibrators 4 output to the boosting amount calculation unit 732 are constantly updated to the latest values. Accordingly, even when the resonance frequencies f0 of the respective vibrators 4 are changed due to e.g. environmental changes, temporal changes, or the like, stable vibration may be maintained in the respective vibrators 4.

In the above described second embodiment, the same effects as those of the first embodiment are obtained.

Third Embodiment

Figure 18:
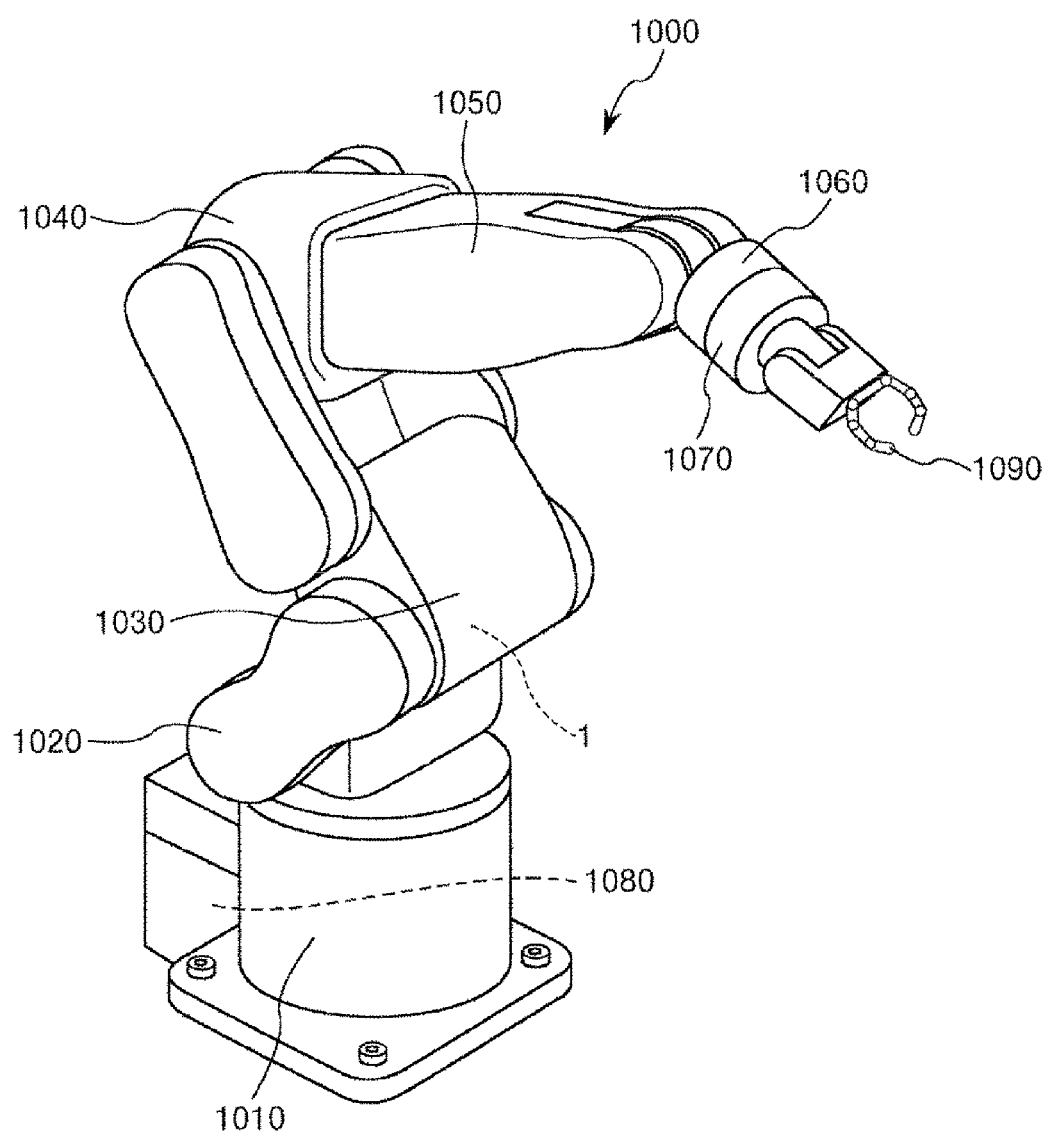
FIG. 18 is a perspective view showing a robot according to a third embodiment.

FIG. 18 is the perspective view showing the robot according to the third embodiment.

A robot 1000 shown in FIG. 18 may perform work of feeding, removing, carrying, assembly, etc. of precision apparatuses and components forming the apparatuses. The robot 1000 is a six-axis robot, and has a base 1010 fixed to a floor or ceiling, an arm 1020 pivotably coupled to the base 1010, an arm 1030 pivotably coupled to the arm 1020, an arm 1040 pivotably coupled to the arm 1030, an arm 1050 pivotably coupled to the arm 1040, an arm 1060 pivotably coupled to the arm 1050, an arm 1070 pivotably coupled to the arm 1060, and a control apparatus 1080 that controls driving of these arms 1020, 1030, 1040, 1050, 1060, 1070.

In the arm 1070, a hand coupling part is provided, and an end effector 1090 according to work to be executed by the robot 1000 is attached to the hand coupling part. The piezoelectric drive devices 1 are mounted on all or part of respective joint parts and the respective arms 1020, 1030, 1040, 1050, 1060, 1070 pivot by driving of the piezoelectric drive devices 1. Note that the piezoelectric drive device 1 may be mounted on the end effector 1090 and used for driving of the end effector 1090.

The controller 1080 includes a computer having e.g. a processor (CPU), memory, interface, etc. The processor executes predetermined programs stored in the memory, and thereby, controls driving of the respective parts of the robot 1000. Note that the programs may be downloaded from an external server via the interface. All or part of the configurations of the control apparatus 1080 may be provided outside of the robot 1000 and connected via a communication network such as a LAN (local area network).

As described above, the robot 1000 has the piezoelectric drive devices 1.

That is, the robot 1000 according to the embodiment includes the piezoelectric drive device 1 having the first piezoelectric vibrator 4A, the second piezoelectric vibrator 4B, and the third piezoelectric vibrator 4C including the vibrating portions 41 and the distal end portions 44 placed on the vibrating portions 41, in which the distal end portions 44 make elliptic motion by the stretching vibration and the flexural vibration of the vibrating portions 41, the rotor 2 (driven member) driven by the elliptic motion of the distal end portions 44, the drive signal generation circuit 72 that respectively outputs the alternating-current voltage V2 (stretching vibration drive signal) to the first piezoelectric vibrator 4A, the second piezoelectric vibrator 4B, and the third piezoelectric vibrator 4C, the boosting circuit 75A (first boosting circuit) provided between the first piezoelectric vibrator 4A and the drive signal generation circuit 72, the boosting circuit 75B (second boosting circuit) provided between the second piezoelectric vibrator 4B and the drive signal generation circuit 72, and the boosting circuit 75C (third boosting circuit) provided between the third piezoelectric vibrator 4C and the drive signal generation circuit 72.

Further, the piezoelectric drive device 1 has the control circuit 73 that respectively controls the boosting amount of the alternating-current voltage V2 in the boosting circuit 75A, the boosting amount of the alternating-current voltage V2 in the boosting circuit 75B, and the boosting amount of the alternating-current voltage V2 in the boosting circuit 75C. The control circuit 73 controls the resonance frequency f01 of the first piezoelectric vibrator 4A, the resonance frequency f02 of the second piezoelectric vibrator 4B, the resonance frequency f03 of the third piezoelectric vibrator 4C to be close to one another.

According to the piezoelectric drive device 1, even when the same alternating-current voltage V2 is input from the single drive signal generation circuit 72 to the three vibrators 4 of the first piezoelectric vibrator 4A, the second piezoelectric vibrator 4B, and the third piezoelectric vibrator 4C, stable driving can be performed. Accordingly, for example, the robot 1000 that can stably drive even with greater torque and that is easily downsized is obtained.

Fourth Embodiment

Figure 19:
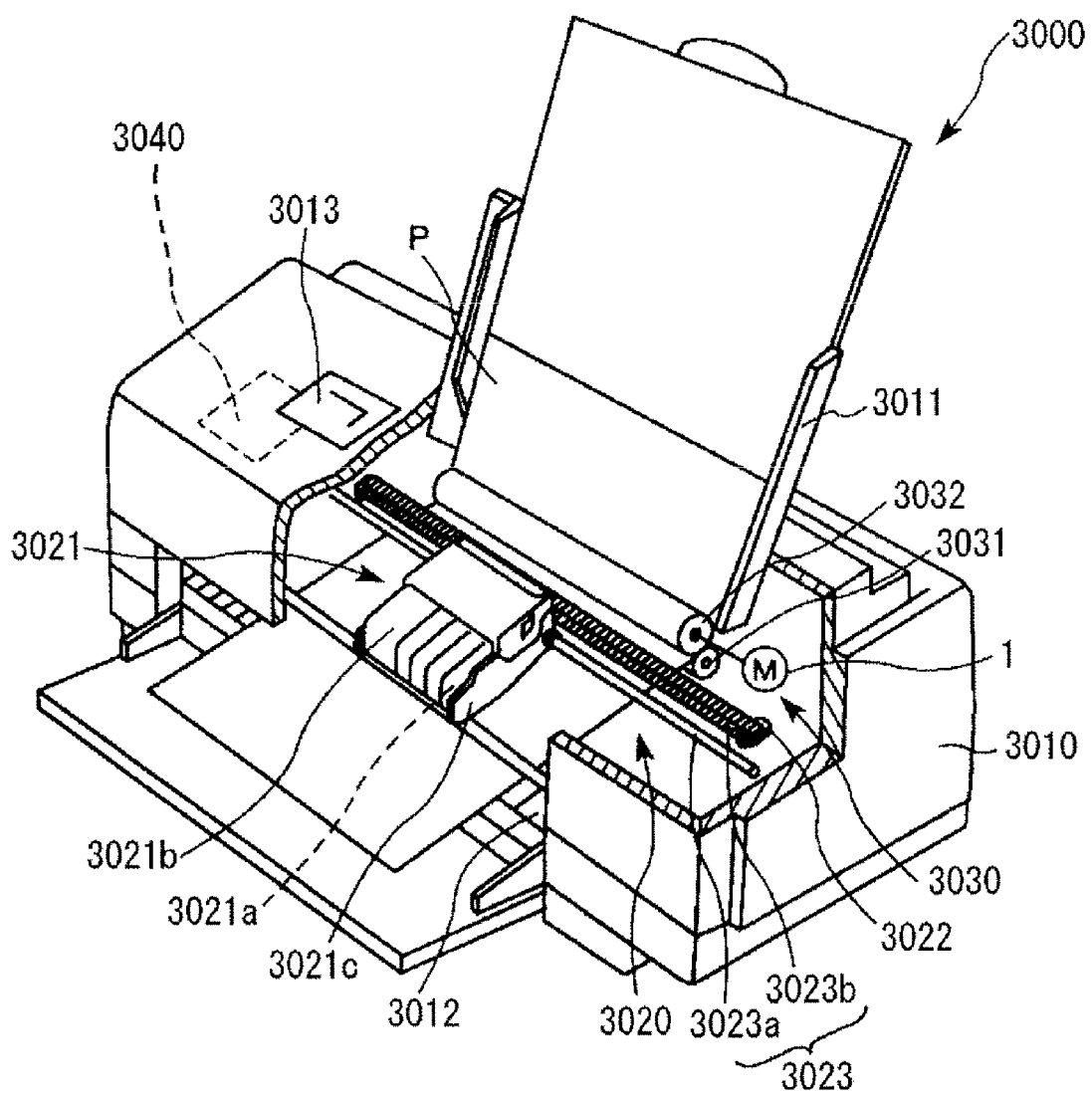
FIG. 19 is a schematic diagram showing an overall configuration of a printer according to a fourth embodiment.

FIG. 19 is the schematic diagram showing the overall configuration of the printer according to the fourth embodiment.

A printer 3000 shown in FIG. 19 includes an apparatus main body 3010, a printing mechanism 3020 provided inside the apparatus main body 3010, a paper feed mechanism 3030, and a control apparatus 3040. In the apparatus main body 3010, a tray 3011 in which recording paper P is placed, a paper eject opening 3012 through which the recording paper P is ejected, and an operation panel 3013 of a liquid crystal display or the like are provided.

The printing mechanism 3020 includes a head unit 3021, a carriage motor 3022, and a reciprocation mechanism 3023 that reciprocates the head unit 3021 by drive power of the carriage motor 3022. The head unit 3021 has a head 3021a as an inkjet recording head, an ink cartridge 3021b that supplies ink to the head 3021a, and a carriage 3021c on which the head 3021a and the ink cartridge 3021b are mounted.

The reciprocation mechanism 3023 has a carriage guide shaft 3023a that reciprocably supports the carriage 3021c and a timing belt 3023b that moves the carriage 3021c on the carriage guide shaft 3023a by the drive power of the carriage motor 3022. The paper feed mechanism 3030 has a driven roller 3031 and a driving roller 3032 in press contact with each other, and the piezoelectric drive device 1 that drives the driving roller 3032.

In the printer 3000, the paper feed mechanism 3030 intermittently feeds the recording paper P one by one to the vicinity of the lower part of the head unit 3021. Concurrently, the head unit 3021 reciprocates in directions substantially orthogonal to the feed direction of the recording paper P, and printing on the recording paper P is performed.

The control apparatus 3040 includes a computer having e.g. a processor such as a CPU, memory, interface, etc. The processor executes predetermined programs stored in the memory, and thereby, controls driving of the respective parts of the printer 3000. For example, the control is executed based on print data externally input via the interface. Note that the programs may be downloaded from an external server via the interface. All or part of the configurations of the control apparatus 3040 may be provided outside the printer 3000 and connected via a communication network such as a LAN (local area network).

As described above, the printer 3000 has the piezoelectric drive device 1.

That is, the printer 3000 according to the embodiment includes the piezoelectric drive device 1 having the first piezoelectric vibrator 4A, the second piezoelectric vibrator 4B, and the third piezoelectric vibrator 4C including the vibrating portions 41 and the distal end portions 44 connected to the vibrating portions 41, in which the distal end portions 44 make elliptic motion by the stretching vibration and the flexural vibration of the vibrating portions 41, the rotor 2 (driven member) driven by the elliptic motion of the distal end portions 44, the drive signal generation circuit 72 that respectively outputs the alternating-current voltage V2 (stretching vibration drive signal) to the first piezoelectric vibrator 4A, the second piezoelectric vibrator 4B, and the third piezoelectric vibrator 4C, the boosting circuit 75A (first boosting circuit) provided between the first piezoelectric vibrator 4A and the drive signal generation circuit 72, the boosting circuit 75B (second boosting circuit) provided between the second piezoelectric vibrator 4B and the drive signal generation circuit 72, and the boosting circuit 75C (third boosting circuit) provided between the third piezoelectric vibrator 4C and the drive signal generation circuit 72.

Further, the piezoelectric drive device 1 has the control circuit 73 that respectively controls the boosting amount of the alternating-current voltage V2 in the boosting circuit 75A, the boosting amount of the alternating-current voltage V2 in the boosting circuit 75B, and the boosting amount of the alternating-current voltage V2 in the boosting circuit 75C. The control circuit 73 controls the resonance frequency f01 of the first piezoelectric vibrator 4A, the resonance frequency f02 of the second piezoelectric vibrator 4B, the resonance frequency f03 of the third piezoelectric vibrator 4C to be close to one another.

According to the piezoelectric drive device 1, even when the same alternating-current voltage V2 is input from the single drive signal generation circuit 72 to the three vibrators 4 of the first piezoelectric vibrator 4A, the second piezoelectric vibrator 4B, and the third piezoelectric vibrator 4C, stable driving can be performed. Accordingly, for example, the printer 3000 that can stably drive in high-speed printing and that is easily downsized is obtained.

Note that, in the embodiment, the piezoelectric drive device 1 drives the driving roller 3032 for paper feed, however, may also drive e.g. the carriage 3021c.

As above, the piezoelectric drive device, robot, and printer according to the present disclosure are explained according to the illustrated embodiments, however, the present disclosure is not limited to those. The configurations of the respective parts may be replaced by arbitrary configurations having the same functions. Further, other arbitrary configurations may be added to the present disclosure. Furthermore, the respective embodiments may be combined as appropriate.

What is claimed is:
1. A piezoelectric drive device comprising:
 a first piezoelectric vibrator and a second piezoelectric vibrator including a vibrating portion and a distal end portion placed in the vibrating portion, in which the distal end portion make elliptic motion by stretching vibration and flexural vibration of the vibrating portion;
 a driven member driven by the elliptic motion of the distal end portion;
 a drive signal generation circuit that outputs stretching vibration drive signals generating the stretching vibration in the first piezoelectric vibrator and the second piezoelectric vibrator and flexural vibration drive sig- nals generating the flexural vibration in the first piezoelectric vibrator and the second piezoelectric vibrator;
a first boosting circuit provided between the first piezoelectric vibrator and the drive signal generation circuit;
a second boosting circuit provided between the second piezoelectric vibrator and the drive signal generation circuit; and
a control circuit that controls a boosting amount of the stretching vibration drive signal in the first boosting circuit and a boosting amount of the stretching vibration drive signal in the second boosting circuit, wherein
the control circuit controls a resonance frequency of the first piezoelectric vibrator and a resonance frequency of the second piezoelectric vibrator to be close.

2. The piezoelectric drive device according to claim 1, wherein
the vibrating portion includes a driving piezoelectric element having a piezoelectric material and an electrode provided on the piezoelectric material, and
the stretching vibration and the flexural vibration are vibrations in a plane parallel to a surface of the electrode.

3. The piezoelectric drive device according to claim 2, wherein
the vibrating portion includes a detection piezoelectric element that detects a vibration of the piezoelectric material,
further comprising a detection signal selection circuit that selectively acquires a first detection signal from the first piezoelectric vibrator and a second detection signal from the second piezoelectric vibrator.

4. The piezoelectric drive device according to claim 3, wherein
the control circuit includes:
a resonance frequency acquisition unit that obtains the resonance frequency of the first piezoelectric vibrator and the resonance frequency of the second piezoelectric vibrator based on the first detection signal and the second detection signal; and
a boosting amount calculation unit that obtains the boosting amount of the stretching vibration drive signal in the first boosting circuit and the boosting amount of the stretching vibration drive signal in the second boosting circuit based on the resonance frequency of the first piezoelectric vibrator and the resonance frequency of the second piezoelectric vibrator.

5. The piezoelectric drive device according to claim 4, wherein
the control circuit controls execution of processing of the resonance frequency acquisition unit and the boosting amount calculation unit on a regular basis.

6. The piezoelectric drive device according to claim 3, wherein
the first piezoelectric vibrator includes a first memory unit,
the second piezoelectric vibrator includes a second memory unit, and
the control unit obtains the boosting amount of the stretching vibration drive signal in the first boosting circuit and the boosting amount of the stretching vibration drive signal in the second boosting circuit based on specific information of the first piezoelectric vibrator stored in the first memory unit and specific information of the second piezoelectric vibrator stored in the second memory unit.

7. A robot comprising a piezoelectric drive device, the piezoelectric drive device having:
a first piezoelectric vibrator and a second piezoelectric vibrator including a vibrating portion and a distal end portion placed in the vibrating portion, in which the distal end portion make elliptic motion by stretching vibration and flexural vibration of the vibrating portion;
a driven member driven by the elliptic motion of the distal end portion;
a drive signal generation circuit that outputs stretching vibration drive signals respectively generating the stretching vibration in the first piezoelectric vibrator and the second piezoelectric vibrator and flexural vibration drive signals generating the flexural vibration in the first piezoelectric vibrator and the second piezoelectric vibrator;
a first boosting circuit provided between the first piezoelectric vibrator and the drive signal generation circuit;
a second boosting circuit provided between the second piezoelectric vibrator and the drive signal generation circuit; and
a control circuit that controls a boosting amount of the stretching vibration drive signal in the first boosting circuit and a boosting amount of the stretching vibration drive signal in the second boosting circuit, wherein
the control circuit controls a resonance frequency of the first piezoelectric vibrator and a resonance frequency of the second piezoelectric vibrator to be close.

8. A printer comprising a piezoelectric drive device, the piezoelectric drive device having:
a first piezoelectric vibrator and a second piezoelectric vibrator including a vibrating portion and a distal end portion placed in the vibrating portion, in which the distal end portion make elliptic motion by stretching vibration and flexural vibration of the vibrating portion;
a driven member driven by the elliptic motion of the distal end portion;
a drive signal generation circuit that outputs stretching vibration drive signals respectively generating the stretching vibration in the first piezoelectric vibrator and the second piezoelectric vibrator and flexural vibration drive signals generating the flexural vibration in the first piezoelectric vibrator and the second piezoelectric vibrator;
a first boosting circuit provided between the first piezoelectric vibrator and the drive signal generation circuit;
a second boosting circuit provided between the second piezoelectric vibrator and the drive signal generation circuit; and
a control circuit that controls a boosting amount of the stretching vibration drive signal in the first boosting circuit and a boosting amount of the stretching vibration drive signal in the second boosting circuit, wherein
the control circuit controls a resonance frequency of the first piezoelectric vibrator and a resonance frequency of the second piezoelectric vibrator to be close.

\* \* \* \* \*